(12) United States Patent
Frederick, Jr.

(10) Patent No.: US 11,069,475 B2
(45) Date of Patent: Jul. 20, 2021

(54) COMPACT ISOLATED INDUCTORS

(71) Applicant: pSemi Corporation, San Diego, CA (US)

(72) Inventor: Norman L. Frederick, Jr., Vista, CA (US)

(73) Assignee: pSemi Corporation, San Diego, CA (US)

( * ) Notice: Subject to any disclaimer, the term of this patent is extended or adjusted under 35 U.S.C. 154(b) by 280 days.

(21) Appl. No.: 16/044,398

(22) Filed: Jul. 24, 2018

(65) Prior Publication Data

US 2020/0035406 A1 Jan. 30, 2020

(51) Int. Cl.
| | |
|---|---|
| *H01F 27/30* | (2006.01) |
| *H01F 27/29* | (2006.01) |
| *H01F 41/071* | (2016.01) |
| *H01L 23/522* | (2006.01) |
| *H01L 49/02* | (2006.01) |

(52) U.S. Cl.
CPC ......... *H01F 27/306* (2013.01); *H01F 27/292* (2013.01); *H01F 41/071* (2016.01); *H01L 23/5227* (2013.01); *H01L 28/10* (2013.01)

(58) Field of Classification Search
CPC .............................. H01F 27/306; H01F 27/292
See application file for complete search history.

(56) References Cited

U.S. PATENT DOCUMENTS

| | | |
|---|---|---|
| 5,510,757 A | 4/1996 | Kumar et al. |
| 5,696,470 A | 12/1997 | Gupta et al. |
| 5,969,560 A | 10/1999 | Kohama et al. |

(Continued)

FOREIGN PATENT DOCUMENTS

| | | |
|---|---|---|
| JP | 2015207614 | 11/2015 |
| JP | 2015207614 A | * 11/2015 |
| WO | 2020/023558 | 1/2020 |

OTHER PUBLICATIONS

Rahman, Hafizur, Office Action received from the USPTO dated Dec. 19, 2017 for U.S. Appl. No. 15/176,940, 6 pgs.

(Continued)

*Primary Examiner* — Mang Tin Bik Lian
*Assistant Examiner* — Malcolm Barnes
(74) *Attorney, Agent, or Firm* — Jaquez Land Greenhaus & McFarland LLP; Alessandro Steinfl, Esq.

(57) ABSTRACT

Structures and methods for reducing physical space of two or three inductors while maintaining low magnetic coupling between the inductors are presented. According to one aspect, the inductors share their volume spaces and have (substantially) orthogonal far field magnetic vectors. According to another aspect, the inductors are fabricated on planar layers of a stacked structure that includes conductive and non-conductive layers. According to an additional aspect, a coil structure of one of the inductors passes through a volume space of another inductor. According to another aspect, coil structures of two of the inductors are interlaced. According to another aspect, relative placement of two coil structures of two inductors is based on a number of windings of one of the two coil structures above and below the other coil structure. According to another aspect, a shape of a coil structure of one inductor follows a near field magnetic vector of another inductor.

19 Claims, 21 Drawing Sheets

(56) References Cited

U.S. PATENT DOCUMENTS

| | | | |
|---|---|---|---|
| 6,653,697 | B2 | 11/2003 | Hidaka et al. |
| 7,138,846 | B2 | 11/2006 | Suwa et al. |
| 7,221,207 | B2 | 5/2007 | Fujumoto et al. |
| 7,880,559 | B2 | 2/2011 | Ouacha et al. |
| 9,131,604 | B1 | 9/2015 | Watt |
| 10,097,232 | B2 | 10/2018 | Bacon |
| 10,172,231 | B2 | 1/2019 | Horvath et al. |
| 2005/0195063 | A1 | 9/2005 | Mattsson |
| 2007/0236319 | A1* | 10/2007 | Hsu ............... H01L 23/5227 336/200 |
| 2014/0253404 | A1* | 9/2014 | Ikemoto ......... G06K 19/07779 343/788 |
| 2014/0306776 | A1 | 10/2014 | Eom |
| 2014/0327495 | A1 | 11/2014 | He et al. |
| 2017/0359056 | A1 | 12/2017 | Horvath et al. |
| 2017/0359058 | A1* | 12/2017 | Bacon ............... H01P 1/127 |
| 2018/0130595 | A1* | 5/2018 | Choi ............... H01F 17/0013 |
| 2018/0294090 | A1* | 10/2018 | Nishikawa ........... H01F 5/003 |

OTHER PUBLICATIONS

Rahman, Hafizur, Office Action received from the USPTO dated Jun. 15, 2018 for U.S. Appl. No. 15/176,940, 18 pgs.

Rahman, Hafizur, Notice of Allowance received from the USPTO dated Nov. 2, 2018 for U.S. Appl. No. 15/176,940, 18 pgs.

Horvath, et al., Response filed in the USPTO dated Feb. 15, 2018 for U.S. Appl. No. 15/176,940, 11 pgs.

Horvath, et al., Response filed in the USPTO dated Aug. 8, 2018 for U.S. Appl. No. 15/176,940, 18 pgs.

Takaoka, Dean, Office Action received from the USPTO dated Feb. 16, 2018 for U.S. Appl. No. 15/377,626, 19 pgs.

Takaoka, Dean, Notice of Allowance received from the USPTO dated Aug. 15, 2018 for U.S. Appl. No. 15/377,626, 16 pgs.

Kardinal, Ingrid, International Search Report and Written Opinion received from the EPO dated Oct. 28, 2019 for appln. No. PCT/US2019/043121, 14 pgs.

* cited by examiner

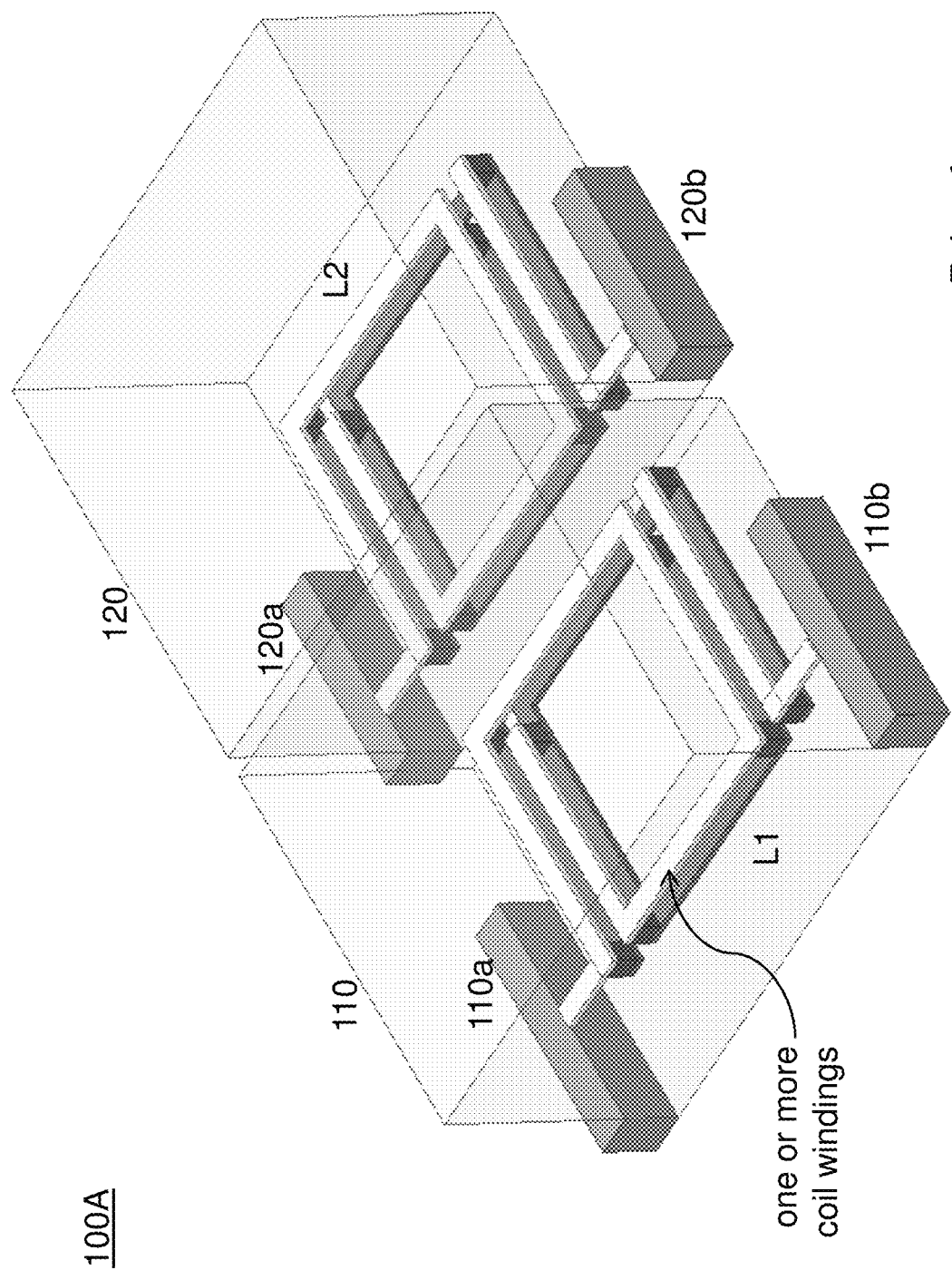
FIG. 1A  *Prior Art*

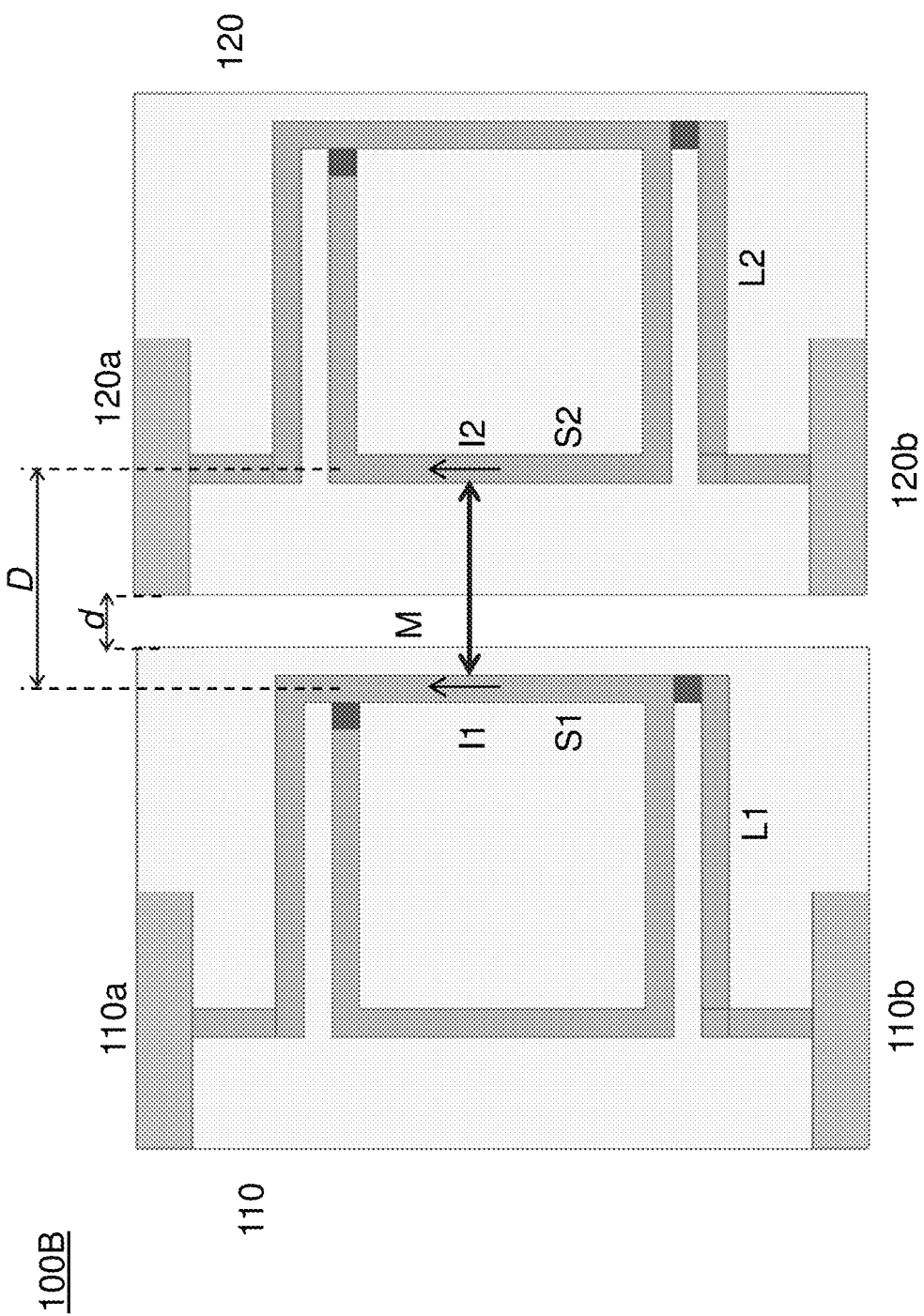
FIG. 1B  *Prior Art*

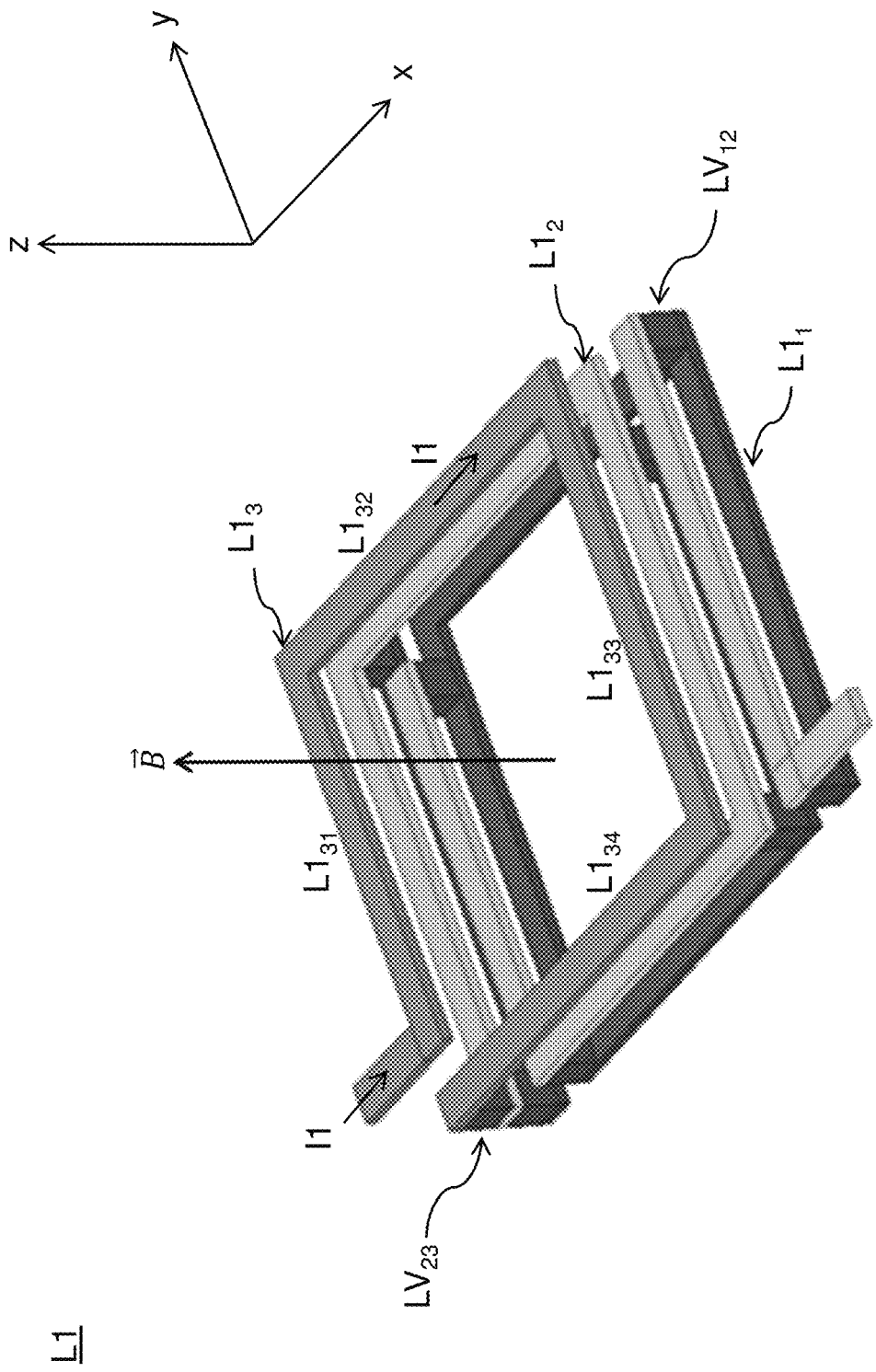
FIG. 1C  *Prior Art*

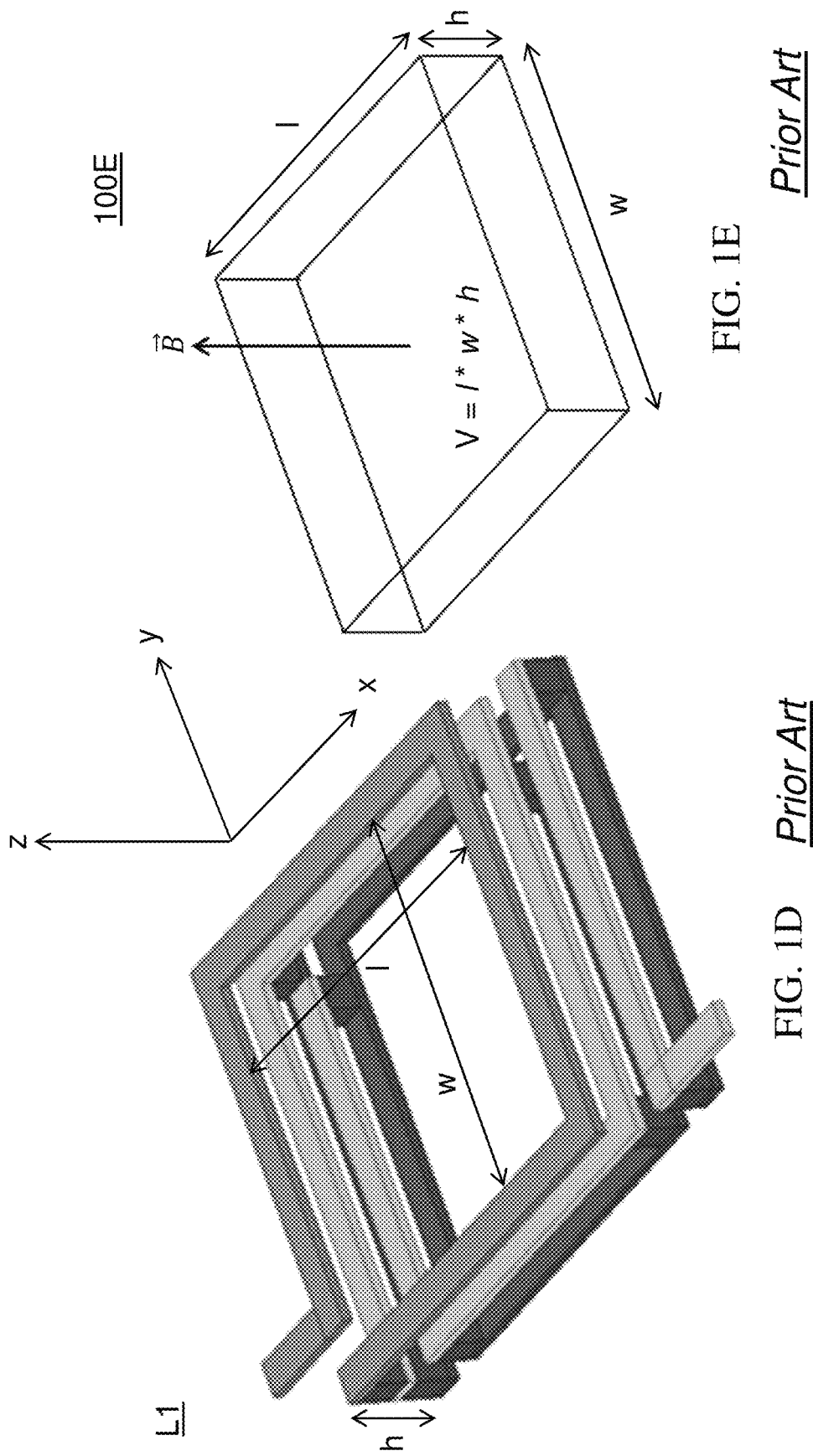
FIG. 1D *Prior Art*
FIG. 1E *Prior Art*

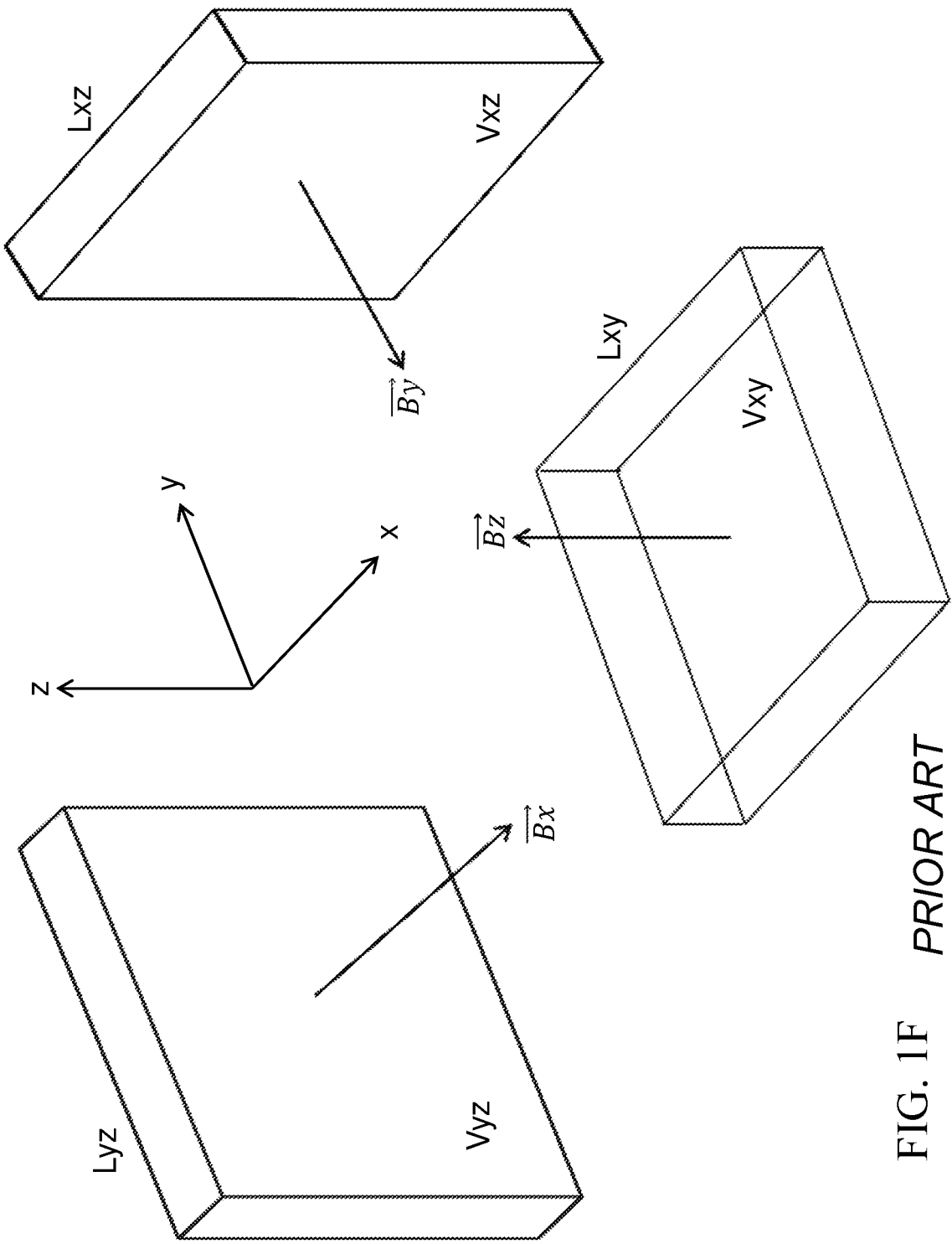
FIG. 1F  _PRIOR ART_

COMPACT ISOLATED INDUCTORS

CROSS REFERENCE TO RELATED APPLICATIONS

The present application may be related U.S. patent application Ser. No. 15/176,940, entitled "Method and Apparatus for Reducing RF Crossover Coupling", filed on Jun. 8, 2016, the disclosure of which is incorporated herein by reference in its entirety. This application describes some known in the art techniques to form metal structures across different layers on a substrate.

TECHNICAL FIELD

The present teachings relate to electronic circuits. In particular, the present teachings relate to inductors used in such circuits, including methods and structures to form isolated inductors in a reduced space.

BACKGROUND

It is well known in the art that inductors constitute essential elements of today's electronic circuits, whether in low frequency (e.g., 60 Hz and lower) high power applications, such as, for example, power conversion circuits, or high frequency (e.g., 10 GHz and higher) low power applications, such as, for example, RF applications. It is also well known in the art that inductors can take a considerable physical area of a circuit, due not only to a relatively large size of coil windings that form the inductors, but also due to extra separation area required between any two inductors in order to reduce magnetic coupling effects between the inductors.

FIG. 1A shows a perspective view of two side by side exemplary prior art discrete inductors 110 and 120, which may be packaged according to any known (or future) packaging technology, such as, for example, a surface mount device (SMD) shown in the figure, or other, such as, for example, integrated passive device (IPD), low temperature co-fired ceramics (LTCC), or any other integrated structure comprising one or more metal layers used to form one or more coil windings L1, L2, of the inductors. In the exemplary case depicted in FIG. 1A, each of the two inductors 110, 120, can be coupled to an electronic circuit through respective terminals (110a, 110b) and (120a, 120b) which are connected to two ends of the respective coil windings L1 and L2. A person skilled in the art would clearly understand that in a packaged configuration of the discrete inductors 110 and 120, the respective terminals may be referred to as pads.

FIG. 1B shows a top plane view of the two discrete inductors 110 and 120 used in an electronic circuit. It is well known in the art that, as can be seen in FIG. 1B, a spacing (separation space) d between the two inductors, 110 and 120, is selected so to reduce magnetic coupling effects between the two inductors. A person skilled in the art would know that such magnetic effects are mainly due to the near field magnetic vectors coupling. For example, considering the conductive segments S1 and S2 of the respective coil windings L1 and L2, a current I1 flowing in the segment S1 can induce a magnetic field that couples, via a mutual inductance M between the two segments S1 and S2, to the segment S2, and which coupling in turn induces a current I2 into the segment S2, and therefore into the coil windings L2. Such magnetically induced current can be seen in the electronic circuit as an undesirable cross talk between two parts of the circuit using the different inductors 110 and 120.

As the mutual inductance M is strongly correlated to the distance D between the two segments S1 and S2, as known to a person skilled in the art, reduction in the magnetic coupling effect is obtained by adjusting (increasing) the separation space d between the two inductors 110 and 120. This in turn requires for an extra area of the circuit to be allocated to the usage of the two inductors 110 and 120.

A motivation for the teachings according to the present disclosure is to provide compact isolated inductors with reduced physical space requirements while maintaining low magnetic coupling between the inductors.

SUMMARY

According to a first aspect of the present disclosure, a multi-layered structure referenced in a coordinate space (x, y, z) is presented, the multi-layered structure comprising: a first inductor defined by a first coil structure, wherein the first coil structure defines a first volume space of the first inductor; and a second inductor defined by a second coil structure, wherein the second coil structure defines a second volume space of the second inductor; wherein the first volume space and the second volume space comprise a common shared volume space of the coordinate space (x, y, z), and wherein a first far field magnetic vector of the first inductor is substantially orthogonal to a first far field magnetic vector of the second inductor.

According to second aspect of the present disclosure, a method for magnetically isolating two inductors is presented, the method comprising: forming a first coil structure of a first inductor, the coil structure defining a first volume space of the first inductor; and forming a second coil structure of a second inductor, the second coil structure defining a second volume space of the second inductor, wherein the second volume space and the first volume space comprise a shared volume space, and wherein a far field magnetic vector of the first inductor is substantially orthogonal to a far field magnetic vector of the second inductor.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1A shows a perspective view of two exemplary prior art discrete inductors.

FIG. 1B shows a top plane view of the two discrete inductors of FIG. 1A, separated by a spacing to reduce magnetic coupling effects between the two inductors.

FIG. 1C shows exemplary multilayered structures that form one or more coil windings of a prior art discrete inductor.

FIG. 1D shows exemplary dimensions in a coordinate space (x, y, z) of the discrete inductor of FIG. 1C.

FIG. 1E shows a far field magnetic vector of the prior art discrete inductor of FIG. 1C, with dimensions according to FIG. 1D, formed in a volume space of the inductor.

FIG. 1F shows volume spaces Vxy, Vxz, Vyz of three adjacent inductors Lxy, Lxz, Lyz and corresponding magnetic vectors $\vec{Bz}, \vec{By}, \vec{Bx}$.

DETAILED DESCRIPTION

Figure 2A:
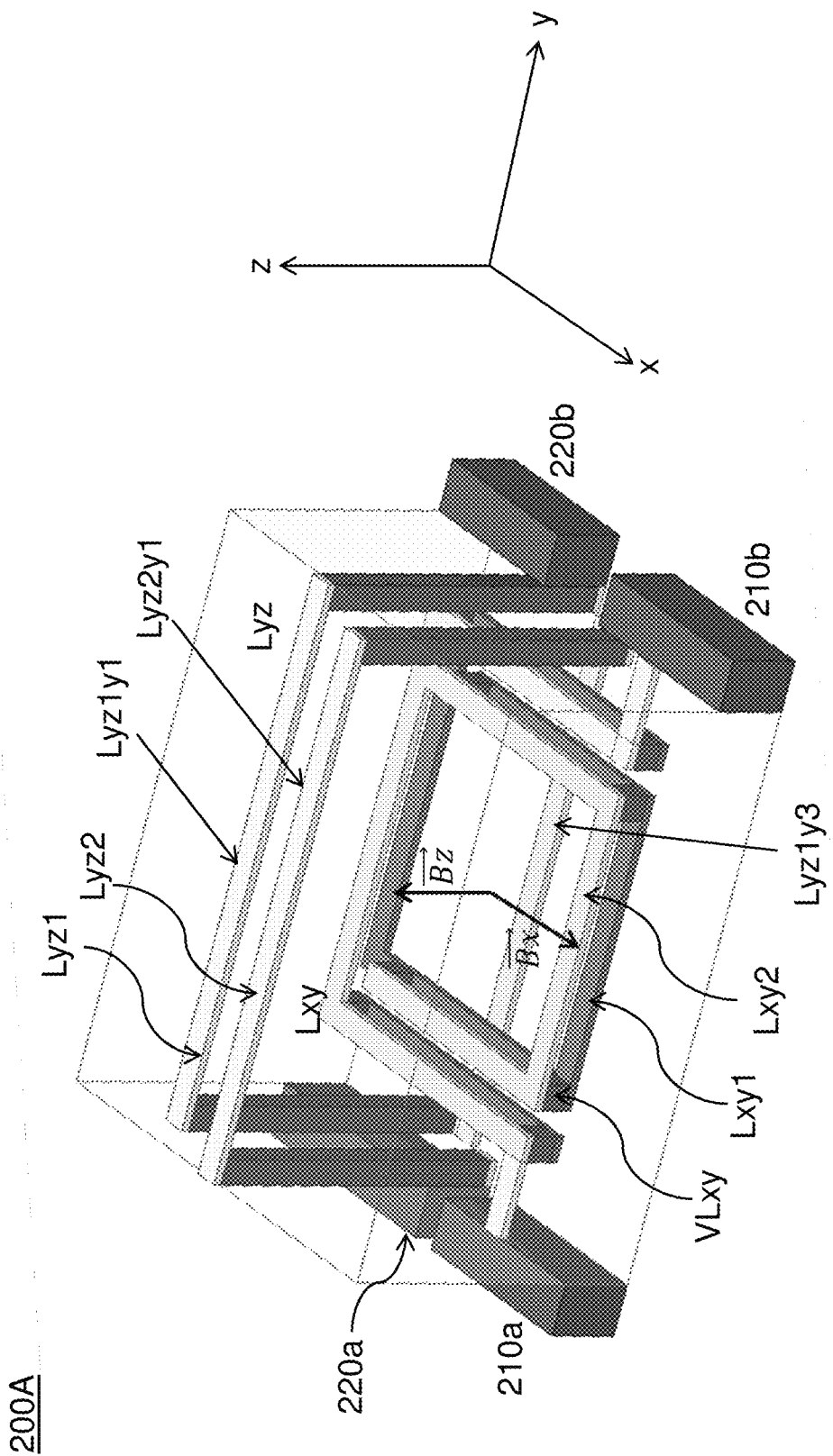
FIG. 2A shows an exemplary embodiment according to the present disclosure of two compact isolated inductors with shared volume spaces.

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes compact isolated inductors used in electrical circuits which can provide for a reduced physical space (compact) while maintaining low magnetic coupling (isolated) between such inductors. The compact isolated inductors according to the present teachings can be sized according to any inductance required by design, and used in any electronic circuit, such as, for example, in electronic circuits used in electronic devices (e.g., cell phones, radios) having a plurality of devices, such as for example, transistors (e.g., MOSFETs). A person skilled in the art will appreciate that such electrical circuits comprising transistors can be arranged as amplifiers, such as, power amplifiers (PA's) for amplifying RF signals for transmission, and/or low noise amplifiers (LNA's) for receiving RF signals. The compact isolated inductors according to the present teachings can be used, for example, in RF filters, matching circuits and/or as degenerating inductors in LNA circuits. The compact isolated inductors according to the present teachings can be used in power applications, such as, for example, AC-DC conversion applications, or as chokes to limit or suppress flow of AC current without affecting DC current. The compact isolated inductors according to the present teachings can be used in any application with signal frequencies ranging from low frequency (e.g., 60 Hz and lower) to high frequency (e.g., 10 GHz and higher).

FIG. 1C shows an exemplary multilayered coil structure L1 of a prior art discrete inductor, such as, for example, the discrete inductor 110 of FIG. 1A, referenced with respect to a (Cartesian) coordinate space (x, y, z). As can be seen in FIG. 1C, the exemplary multilayered coil structure L1 comprises one or more coil windings (L11, L12, L13), each formed in a different layer defined in the figure by an (x, y) plane positioned at a different z coordinate. In the exemplary configuration shown in FIG. 1C, the coil windings (L11, L12, L13) are of a substantially same shape, and each is formed on a separate layer (x, y, $z_n$) of the multilayered structure by way of a plurality of conductive (e.g., metal) segments. For example, as can be seen in FIG. 1C, the coil winding L13 comprises four conductive segments ($L1_{31}$, $L1_{32}$, $L1_{33}$, $L1_{34}$) arranged on a same layer and forming a substantially quadrilateral shape, where the conductive segments are joined to form a single conductive coil winding. In addition, the coil windings ($L1_1$, $L1_2$, $L1_3$) formed on different layers are joined through substantially vertical conductive vias (e.g., $LV_{12}$, $LV_{23}$) of the multilayered coil structure L1 to form a single coil having multiple windings. It should be noted that a person skilled in the art would clearly understand that other coil structures formed on a single layer or multiple layers beyond the exemplary three layers showed in FIG. 1C can be envisioned. Also, other coil winding shapes beyond the exemplary quadrilateral shape depicted in FIG. 1C can be envisioned, such as, for example, any number of segments (either straight or curved having a curvature) arranged to form a substantially closed shape (polygon, circle) or portions of the substantially closed shape that are joined across several layers to form the substantially closed shape. A person skilled in the art would clearly understand that other factors, such as manufacturing technology used in the forming of the multilayered structures, and associated cost, may dictate practical implementations of the multilayered coil structure L1. Some description of the forming of such multilayered structures can be found, for example, in the above referenced U.S. patent application Ser. No. 15/176,940, the disclosure of which is incorporated herein by reference in its entirety. In particular, as it is well known in the art, one or more stacked layers (e.g., metal/conductive layer, non-conductive layer, dielectric layer, etc.) can be used to form structures of the multilayered coil structure that are connected across the stacks through vias. In some cases, the stacked layers can be overlaid atop a semiconductor substrate and used to form monolithically integrated electronic circuits according to any known fabrication technology, including, but not limited to, silicon-on-sapphire (SOS) and silicon-on-insulator (SOI) technologies.

With further reference to FIG. 1C, a person skilled in the art would clearly understand that a flow of current, I1, through the multilayered coil structure L1 is mainly constrained to the (x, y) plane and therefore, as depicted in FIG. 1C, a far field magnetic vector, $\vec{B}$, induced by the current I1, is in a direction orthogonal to the (z, y) plane, or in other words, in the z-direction with reference to the coordinate space (x, y, z). It should be noted that a person skilled in the art is well aware of near field and far field magnetic vectors induced by current flow through an inductor, such as one depicted in FIG. 1C, description of which is outside the scope of the present disclosure.

As used herein, the terms "coil", coil structure", "multilayered coil structure" refer to the coil that forms an inductor, and consequently define physical, electrical and magnetic characteristics of the inductor. Therefore, as used herein, the terms "coil", "coil structure", "multilayered coil structure" are used interchangeably with the term "inductor". As used herein, and unless otherwise described, the term "magnetic field" of an inductor is referred to as the magnetic field defined by the far field magnetic vector $\vec{B}$ shown in FIG. 1C.

FIG. 1D shows exemplary dimensions of the multilayered coil structure L1 in the coordinate space (x, y, z). Due to the exemplary substantially quadrilateral shape of the coil windings ($L1_1$, $L1_2$, $L1_3$), the dimensions can be represented by a length l along the x-direction, a width w along the y-direction, and a height h along the z-direction, as shown in FIG. 1D. It should be noted that as can be seen in FIG. 1D, the length l and the width w respectively represent an inner width between two opposite side segments (e.g., ($L1_{31}$, $L1_{33}$) and ($L1_{32}$, $L1_{34}$) shown in FIG. 1C), of the coil windings ($L1_1$, $L1_2$, $L1_3$). Therefore, as shown in FIG. 1E, the quantity V=l*w*h, represents a volume space inside the multilayered coil structure L1, and the far field magnetic vector, $\vec{B}$, passes through a point of the volume space V that is substantially positioned in the middle of the volume in the (x, y) plane. A person skilled in the art is well aware that in the case of a multilayered inductor structure, such volume space can be filled with non-conductive material, such as, for example, a dielectric material or void.

As used herein, the expression "volume space of an inductor" refers to the volume V described above in relation to FIG. 1D and FIG. 1E. In other words, the volume space is a three-dimensional space defined by, or bounded by, the inner contours of the one or more coil windings of an inductor. A person skilled in the art would clearly understand that the volume space would be different for different shapes of the coil windings, where the coil winding may be shaped according to, for example, a polygon or a circle.

As it is known in the art, magnetic coupling effects of two adjacent inductors can be reduced by relative placement of the inductors such that the corresponding magnetic vectors $\vec{B}$ are orthogonal (e.g., substantially orthogonal). FIG. 1F shows volume spaces Vxy, Vxz, Vyz of three adjacent inductors Lxy, Lxz, Lyz and corresponding magnetic vectors $\vec{Bz}$, $\vec{By}$, $\vec{Bx}$. The inductor Lxy, defined by a magnetic vector $\vec{Bz}$ that is in the z-direction of the coordinate space (x, y, z), includes one or more coil windings that are formed in the (x, y) plane so to define a current flow through the inductor Lxy that is substantially constrained to the (x, y) plane. The inductor Lxz, defined by a magnetic vector $\vec{By}$ that is in the y-direction of the coordinate space (x, y, z), includes one or more coil windings that are formed in the (x, z) plane so to define a current flow through the inductor Lxz that is substantially constrained to the (x, z) plane. The inductor Lyz, defined by a magnetic vector x that is in the x-direction of the coordinate space (x, y, z), includes one or more coil windings that are formed in the (y, z) plane so to define a current flow through the inductor Lyz that is substantially constrained to the (y, z) plane. Accordingly, since the magnetic vectors $\vec{Bz}$, $\vec{By}$, $\vec{Bx}$ are (substantially) orthogonal to one another, then such relative placement of the inductors as shown in FIG. 1D can reduce magnetic coupling effects between any two inductors of the inductors Lxy, Lxz and Lyz. The teachings according to the present disclosure, re-use, or share, (portions of) the volume spaces of two or three inductors while maintaining (substantial) orthogonality of the corresponding magnetic vectors. The re-use, or sharing, of the volume spaces according to the present teachings allows for a more compact implementation of the inductors. Such compact implementation can be based on discrete (multi-) inductor packages that can be used as components of a printed circuit board, or based on inductors implemented as part of a monolithically integrated circuit, with inductor structures (coil windings and corresponding segments) coexisting with other electronic devices (e.g., transistors) on stacked layers overlying a substrate.

FIG. 2A shows an exemplary embodiment according to the present disclosure of two compact isolated inductors (200A). Each of the two inductors is defined by a respective multilayered coil structure, Lxy, Lyz, having respective volume spaces, Vxy, Vyz, (not shown for clarity purposes) that are shared volume spaces, so to allow for a reduction in the combined size of the two inductors, while maintaining magnetic isolation of the two inductors through the geometries of respective coil windings, (Lxy1, Lxy2), (Lyz1, Lyz2), of the two inductors so to define corresponding magnetic vectors, Bz, Bx, that are orthogonal. As can be seen in FIG. 2A, windings (Lxy1, Lxy2) of the inductor Lxy are planar according to the plane (x, y), therefore defining a current path through the inductor Lxy that is substantially constrained to the (x, y) plane and a corresponding magnetic vector, $\vec{Bz}$, that is in the z-direction of the coordinate space (x, y, z). On the other hand, as can be seen in FIG. 2A, windings (Lyz1, Lyz2) of the inductor Lyz are planar according to the plane (y, z), therefore defining a current path through the inductor Lyz that is substantially constrained to the (y, z) plane and a corresponding magnetic vector, $\vec{Bx}$, that is in the x-direction of the coordinate space (x, y, z).

In the exemplary embodiment according to the present disclosure depicted in FIG. 2A, the coil structures Lxy and Lyz of the two inductors are shown as part of a discrete package (e.g., SMD, IPD, LTCC, other known or future packages) that can be mounted (soldered) on a printed circuit board through respective terminals (210a, 210b) and (220a, 220b) which are connected to two ends of respective coil windings. It should be noted that such configuration based on a discrete packaging should not be considered as limiting the scope of the present invention as the compact isolated inductors according to the present teachings can be integrated in other packages or be part of a monolithically integrated circuit and coexisting with other electronic devices that make part of an electronic circuit.

With continued reference to FIG. 2A, as described above with reference to FIG. 1C, each of the two coil structures Lxy and Lyz may be formed by way of a combination of coil windings that join to form the respective coil structures. For example, as can be seen in FIG. 2A, the exemplary coil structure Lxy comprises two coil windings (Lxy1, Lxy2) that are connected by way of at least one conductive structure VLxy, and similarly, the coil structure Lyz comprises two coil windings (Lyz1, Lyz2) that are connected by way of at least one conductive structure VLyz (shown in FIG. 2C later described). A person skilled in the art would clearly realize that, the conductive structure VLxy connects the coil windings Lxy1 and Lxy2 through a gap that separates such coil windings in the z-direction (i.e., direction orthogonal or substantially orthogonal) to the plane (x, y) of the coil windings), and the conductive structure VLyz (shown in FIG. 2C later described) connects the coil windings Lyz1 and Lyz2 through a gap that separates such coil windings in the x-direction (i.e., direction orthogonal to the plane (y, z) of the coil windings).

A person skilled in the art would clearly realize that stacked layers (e.g., metal/conductive layer, non-conductive layer, dielectric layer, etc.) used to form the two coil structures Lxy and Lyz, can comprise a plurality of planar layers stacked over one another in a direction that is orthogonal to a plane of the stacked layers. Considering the coordinate space (x, y, z) of FIG. 2A, such planar layers may be according to a plane defined by any two coordinates of the coordinate space (x, y, z), and stacked according to an orthogonal direction to such plane defined by a third coordinate. For example, the planar layers may be according to a plane defined by the coordinates (x, y), stacked in the z-direction, as shown in FIG. 2B.

Figure 2B:
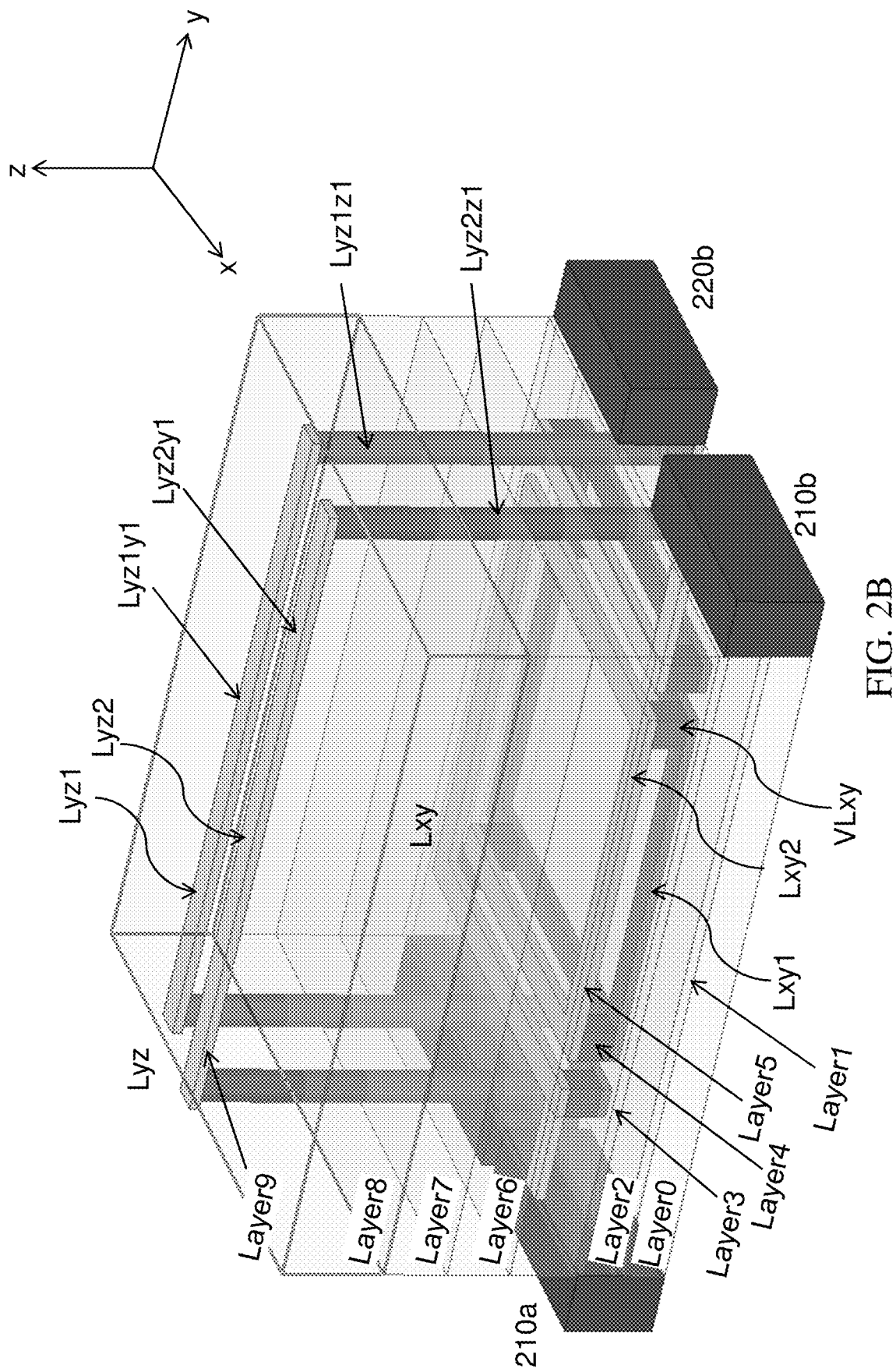
FIG. 2B shows planar layers of a stacked structure used to form multilayered coil structures of the two compact isolated inductors of FIG. 2A.

FIG. 2B shows planar layers (Layer0, . . . , Layer9) of a stacked structure used to form the multilayered coil structures Lxy, Lyz of FIG. 2A. As can be seen in FIG. 2B, each of the planar layers (Layer0 . . . , Layer9) is planar with respect to the (x, y) coordinates of the coordinate space (x, y, z), and are stacked in the z-direction. Therefore, for such exemplary embodiment shown in FIG. 2B, conductive segments in the metal layers, Layer 3 and Layer5, may respectively be used to form the coil windings Lxy1 and Lxy2, and one or more vias, VLxy, through the non-conductive Layer4 may be used to connect the two coil windings Lxy1 and Lxy2. On the other hand, as the two coil windings Lyz1 and Lyz2 are planar according to the (y, z) coordinates, and therefore orthogonal to the planar layers (Layer0, . . . , Layer9), such coil windings may be formed by a combination of horizontal segments (e.g., Lyz1, Lyz2, and Lyz1y3 of FIG. 2A) in the planar layers Layer1 and Layer9 (Lyz1, Lyz2), joined by a series of (substantially) collinear vias (e.g., Lyz1z1, Lyz2z1) that effectively form two opposite (vertical) sides of each of the coil windings Lyz1, Lyz2.

As can be seen in FIG. 2B, the collinear vias Lyz1z1 and Lyz2z1 extend vertically through the planar layers (Layer2, . . . , Layer8) to join the horizontal segments Lyz1y1 and Lyz2y1 to an opposite segment Lyz1y3 (e.g., per FIG. 2A) to form a two windings coil of the inductor Lyz. Conductive structures (e.g., VLyz of FIG. 2C) in the planar Layer1 may be used to join the collinear vias Lyz1z1 and Lyz2z1 to one another or to output terminals (e.g., 220a, 220b) or nodes of the inductor Lyz. A person skilled in the art would clearly understand that forming of one or more coil windings (e.g., Lyz1, Lyz2) of the inductor Lyz can be performed in a variety of ways using at least one coil winding that may be formed by way of conductive structures in two distant planar layers (e.g., Layer1, Layer9) connected through vertical structures formed by way of a plurality of (substantially) collinear vias in the planar layers (e.g., Layer2, . . . , Layer8) between the two distant layers. As shown in the exemplary configuration of FIG. 2B, the vias (e.g., Lyz1z1, Lyz2z1) may each have a substantially round cross section (in the x-y plane), or alternatively, may each have a substantially rectangular cross section (e.g., per FIG. 2A, and FIG. 2C later described), or any other geometries (e.g., polygonal), so long that in combination they can provide a desired vertical shape of the coil windings while maintaining electrical conductivity. Furthermore, it should be noted that exact collinearity of the vias may not be necessary, as irregularity in the vertical alignment of the vias may still be possible. For example, as shown in FIG. 2F, a vertical side of the coil windings Lyz1, Lyz2 may be formed by a combination of vias and/or conductive structures formed in separate layers Layer_k, . . . , Layer_k+6, that may include steps (e.g., offsets) that deviate from a perfect collinear arrangement. Such steps may be in view to a desired shape, including a curvature (shown in FIG. 2F as a dotted line), of the coil windings, and/or design goals and/or limitations.

Figure 2C:
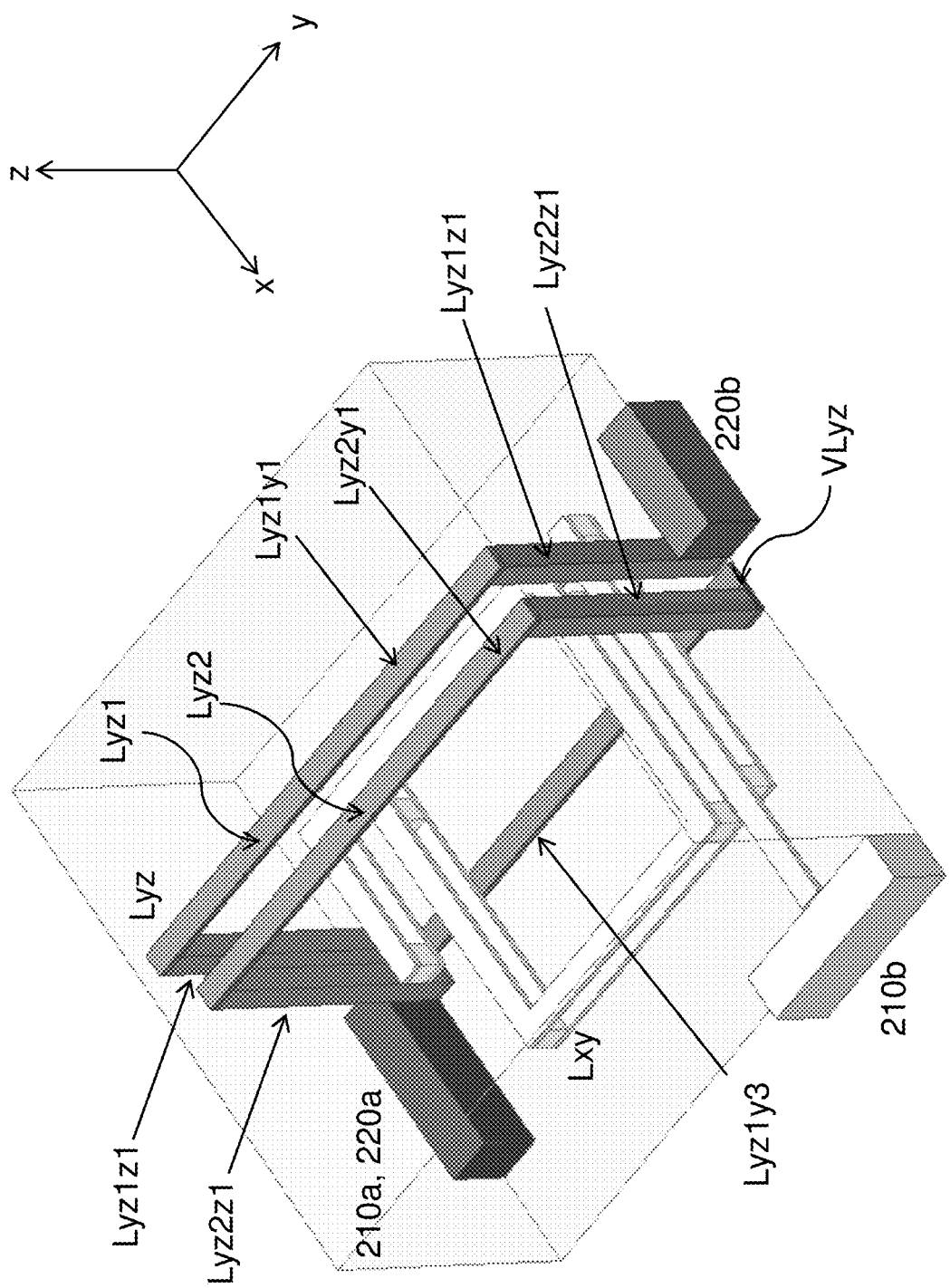
FIG. 2C shows further details of the joining of the two compact isolated inductors.

FIG. 2C shows further details of the joining of the two horizontal segments Lyz1y1 and Lyz2y1 of the two coil windings Lyz1, Lyz2, to the opposite segment Lyz1y3 through the collinear vias Lyz1z1 and Lyz2z1 discussed above in relation to FIGS. 2A and 2B. As can be seen in FIG. 2C, according to an exemplary embodiment of the present disclosure, the segment Lyz1y3 (formed in the Layer1, per FIG. 2B), connects on one side to the horizontal segment Lyz1y1 (formed in the Layer9, per FIG. 2B) by way of collinear vias Lyz1z1 (formed in layers Layer2, . . . , Layer8, per FIG. 2B), and connects on the other side to the horizontal segment Lyz2y1 (formed in the Layer9, per FIG. 2B) by way of collinear vias Lyz2z1 (formed in layers Layer2, . . . , Layer8, per FIG. 2B) and a the conductive structure VLyz formed in the Layer1. Furthermore, as can be seen in FIG. 2C, the horizontal segment Lyz1y1 is connected to the terminal (220b) by way of another set of collinear vias Lyz1z1, while the horizontal segment Lyz2y1 is connected to the terminal (220a) by way of another set of collinear vias Lyz2z1. It should be noted that in the exemplary configuration shown in FIG. 2C, the two inductors Lxy and Lyz share a common terminal (210a, 220a). Such non-limiting common terminal configuration may be based on a design requirement where the two inductors Lxy and Lyz are connected, on one side, to a common node.

Figure 2D:
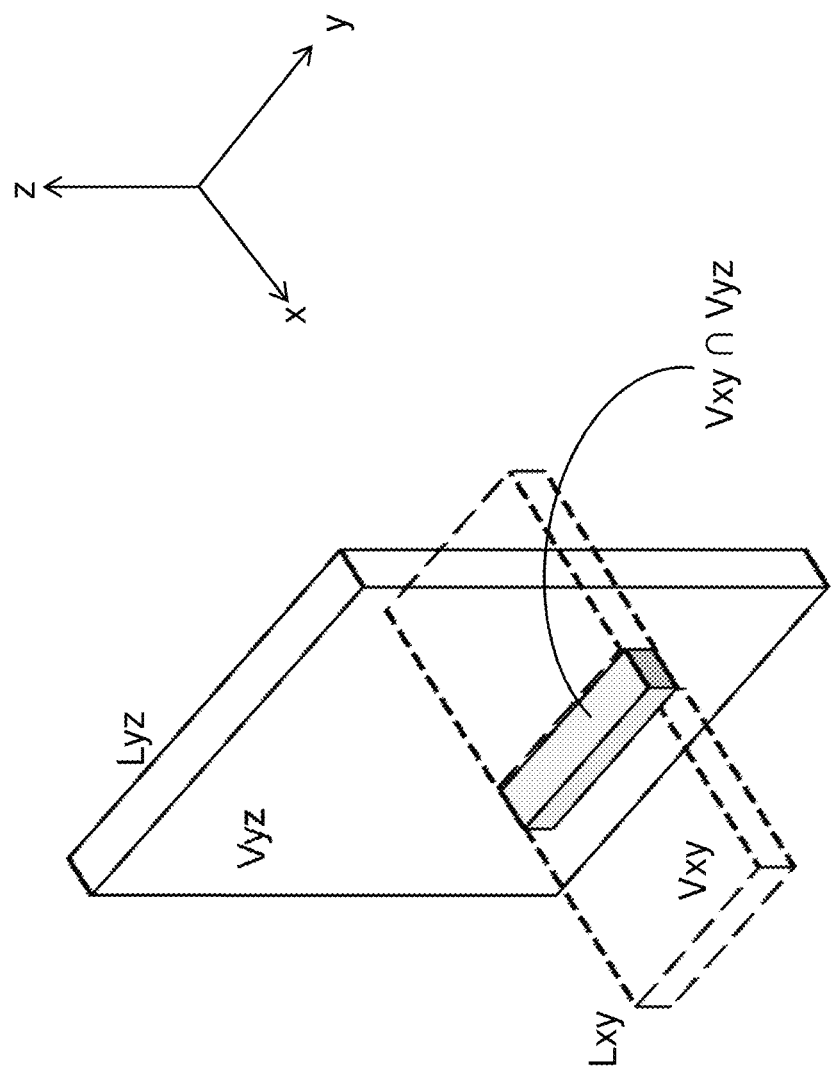
FIG. 2D shows sharing of volume spaces of the two compact isolated inductors.
Figure 2E:
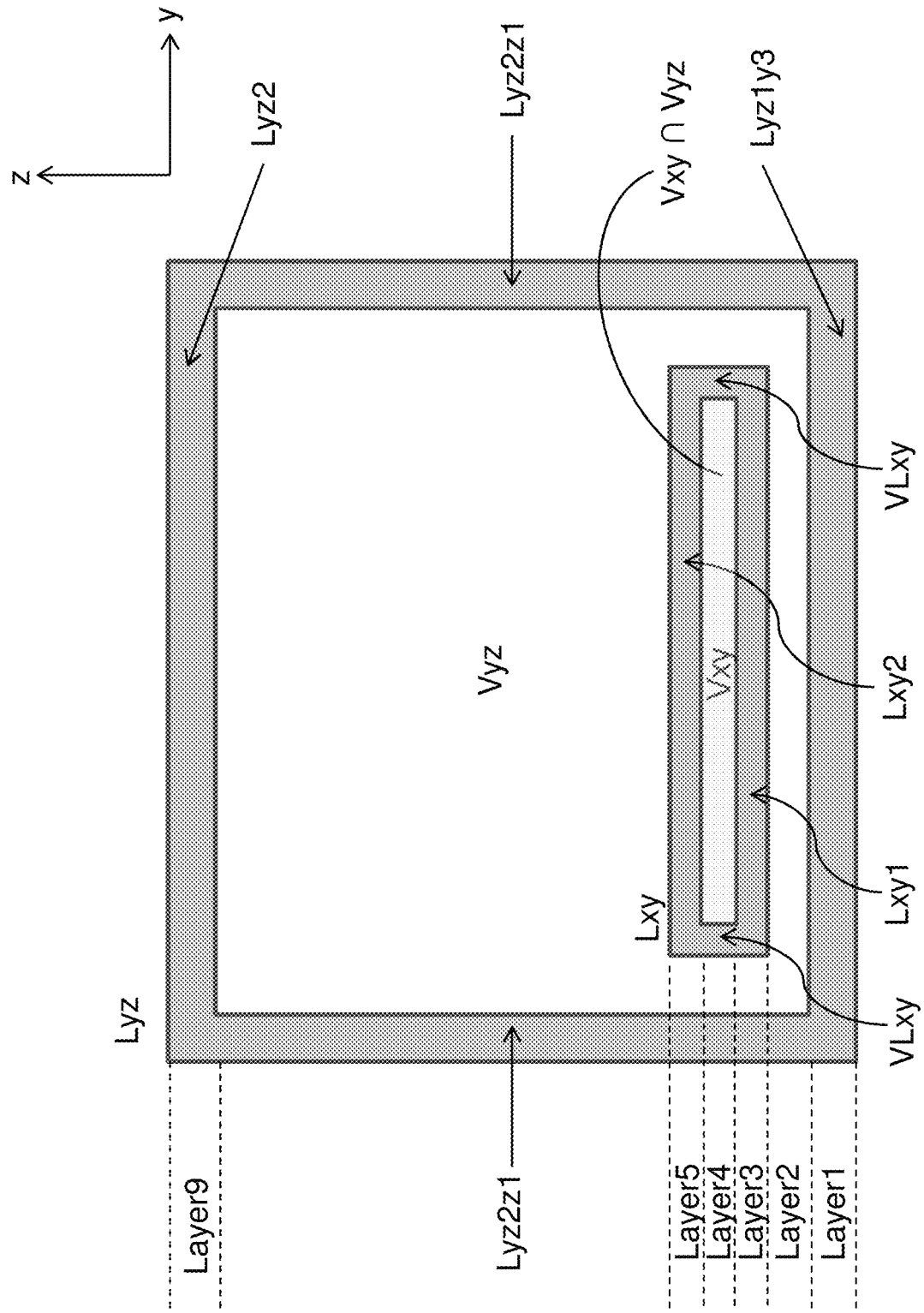
FIG. 2E shows a projection on the (y, z) plane of the two compact isolated inductors.
Figure 2F:
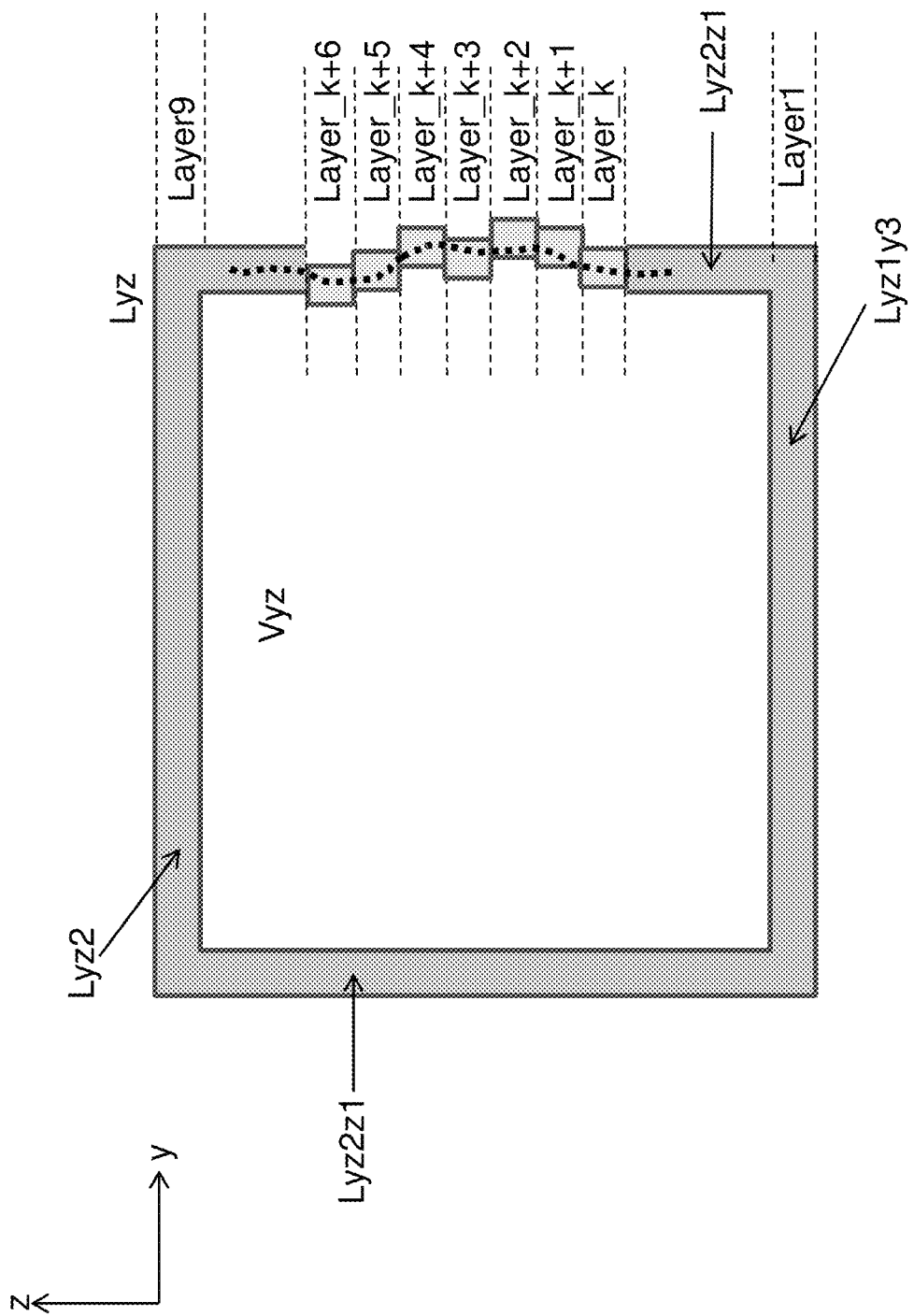
FIG. 2F shows a coil winding with a vertical side having a shape that is provided by way of a plurality of stacked conductive structures.

With continued reference to the exemplary compact isolated inductors shown in FIG. 2C, according to one embodiment of the present disclosure, sharing of the volume spaces Vxy, Vyz (refer to FIGS. 1D, 1C, 1E and related description) of the two inductors may be provided by forming the respective coil structures, Lxy, Lyz, such that one coil structure can be inserted through a volume space of the other, as shown in FIG. 2D. In this case, the coil structure Lxy is inserted through the volume space Vyz of the coil structure Lyz. This is possible if the two coil structures Lxy and Lyz are formed such that a projection on the (y, z) plane of the coil structure Lxy is entirely contained within a projection on the (y, z) plane of the coil structure Lyz, as shown in FIG. 2D and FIG. 2E. It follows that, as shown in FIG. 2D and FIG. 2E, according to an exemplary embodiment of the present disclosure, sharing of the volume spaces Vxy and Vyz of the two inductors Lxy and Lyz is such that a volume space defined by the intersection of the two volume spaces Vxy and Vyz, denoted by Vxy Vyz, has the same projection on the (y, z) plane as a projection on the (y, z) plane of the volume space Vxy.

A person skilled in the art would clearly understand that sharing of the volume spaces, Vxy and Vyz, of the compact isolated inductors defined by the coil structures Lxy and Lyz shown in FIGS. 2A-2E, is made possible by confining coordinates in the (y, z) plane of the structures (e.g., Lxy1, Lxy2, VLxy, etc.) defining the coil structure Lxy, to be within boundaries of a contour that is defined, in the (y, z) plane, by the coordinates of the conductive segments (e.g., Lyz1y1, Lyz2y1, Lyz1y3, Lyz1z1, Lyz2z1, etc.) defining the coil structure Lyz, as shown in FIG. 2E. However, the teachings according to the present disclosure are not limited by such volume sharing as other volume sharing configurations provided by, for example, interlacing of the structures defining the two coil structures Lxy and Lyz are possible, as shown in FIG. 3A.

Figure 3A:
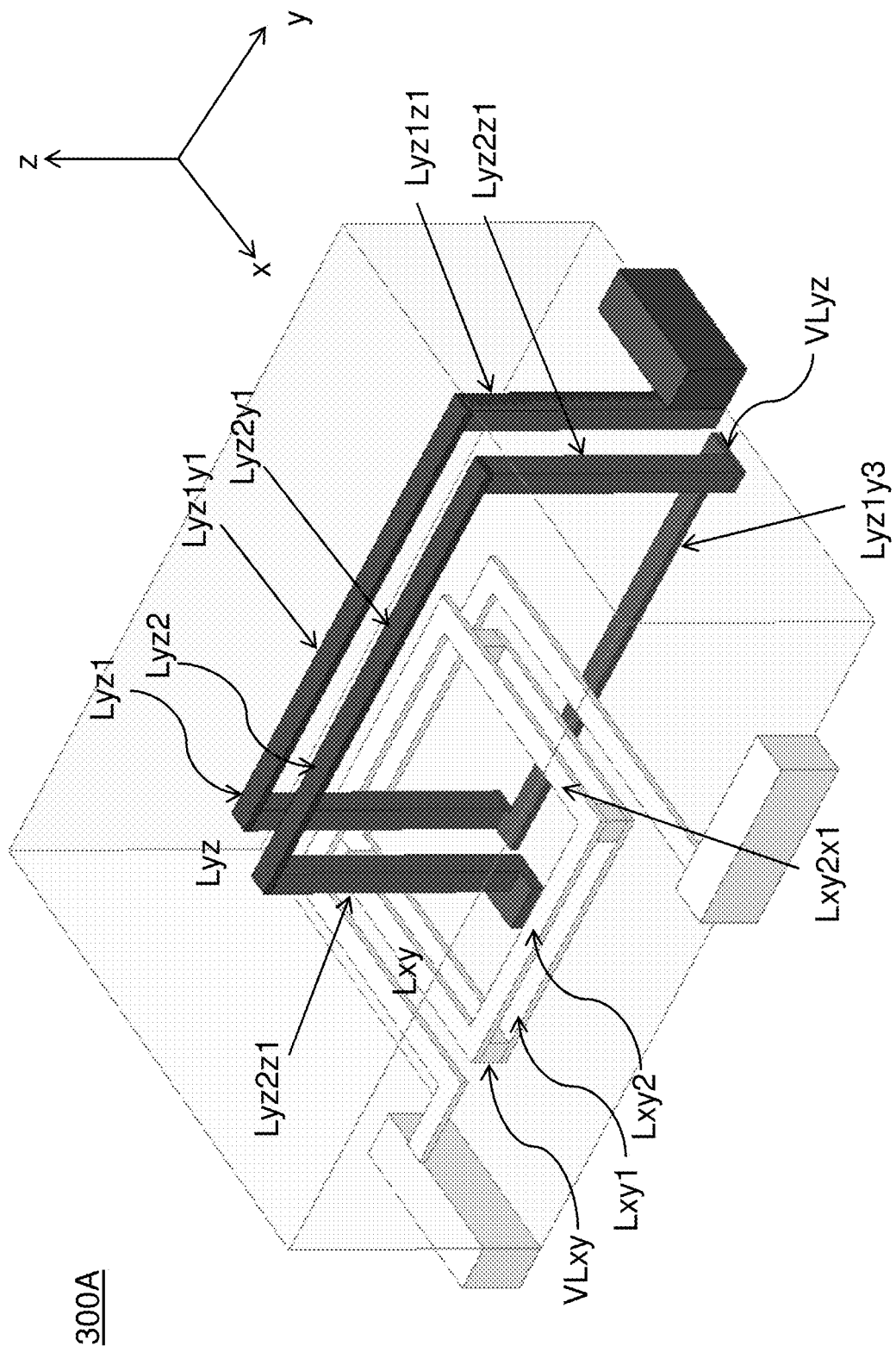
FIG. 3A shows an embodiment according to the present disclosure of two compact isolated inductors with shared volume spaces and interlaced coil structures.

FIG. 3A shows as exemplary embodiment according to the present disclosure of a structure comprising two compact isolated inductors (300A) with shared volume spaces, whose coil structures Lxy, Lyz, are interlaced. As can be seen in FIG. 3A, the coil structure Lxy comprises two coil windings Lxy1, Lxy2 that are joined through at least one via, VLxy. Also, the coil structure Lyz comprises two coil windings Lyz1 and Lyz2 which include segments Lyz1$y$1, Lyz2$y$1, Lyz1$y$3, Lyz1$z$1, Lyz2$z$1 and VLyz as described above in reference to FIGS. 2A-2C. By virtue of being interlaced, a loop formed by the coil structure Lxy closes on a loop formed by the coil structure Lyz, and vice versa. This can clearly be seen in FIG. 3A, as a loop formed by the two coil windings Lyz1 and Lyz2 (e.g., segments Lyz1$y$1, Lyz1$z$1, Lyz1$y$3, VLyz, Lyz2$z$1, Lyz2$y$1) of the coil structure Lyz, closes on a loop formed by structures of the two coil windings (Lxy1, Lxy2) of the coil structure Lxy, and vice versa.

With further reference to FIG. 3A, by virtue of the interlaced configuration of the two coil structures Lxy and Lyz, there exists at least one structure (e.g., Lxy2$x$1) that forms a coil winding (e.g., Lxy2) of the coil structure Lxy that passes through the volume space Vyz (per FIG. 3B) of the coil structure Lyz, and, there exists at least one structure (e.g., Lyz2$z$1) that forms a coil winding (e.g., Lyz2) of the coil structure Lyz that passes through the volume space Vxy (per FIG. 3B) of the coil structure Lxy. It should be noted that this is not the case in the configuration depicted in FIG. 2A, as no structure forming the coil windings Lyz1 or Lyz2 of the coil structure Lyz passes through the volume space Vxy of the coil structure Lxy.

Figure 3B:
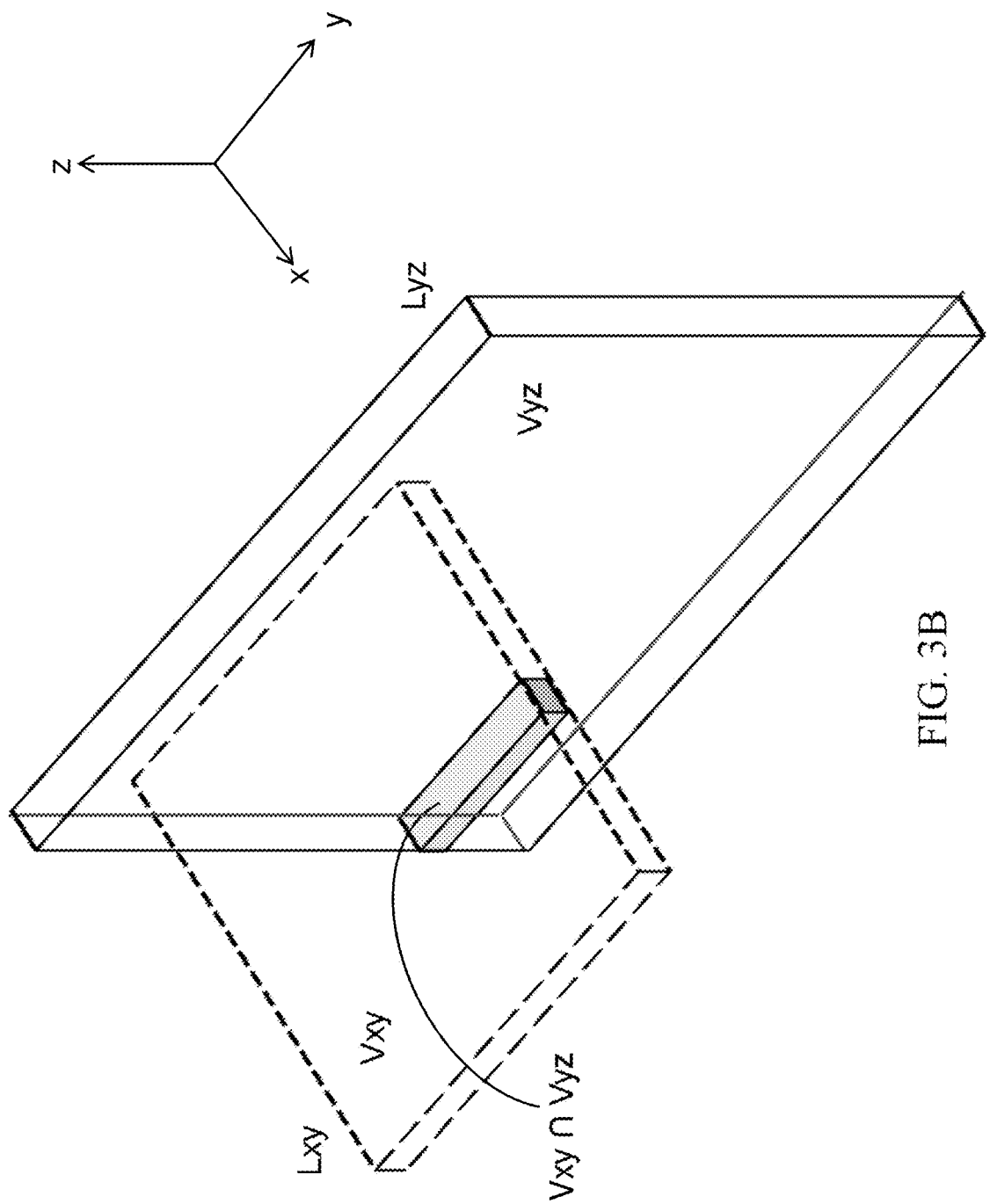
FIG. 3B shows sharing of volume spaces of the two compact isolated inductors of FIG. 3A.
Figure 3C:
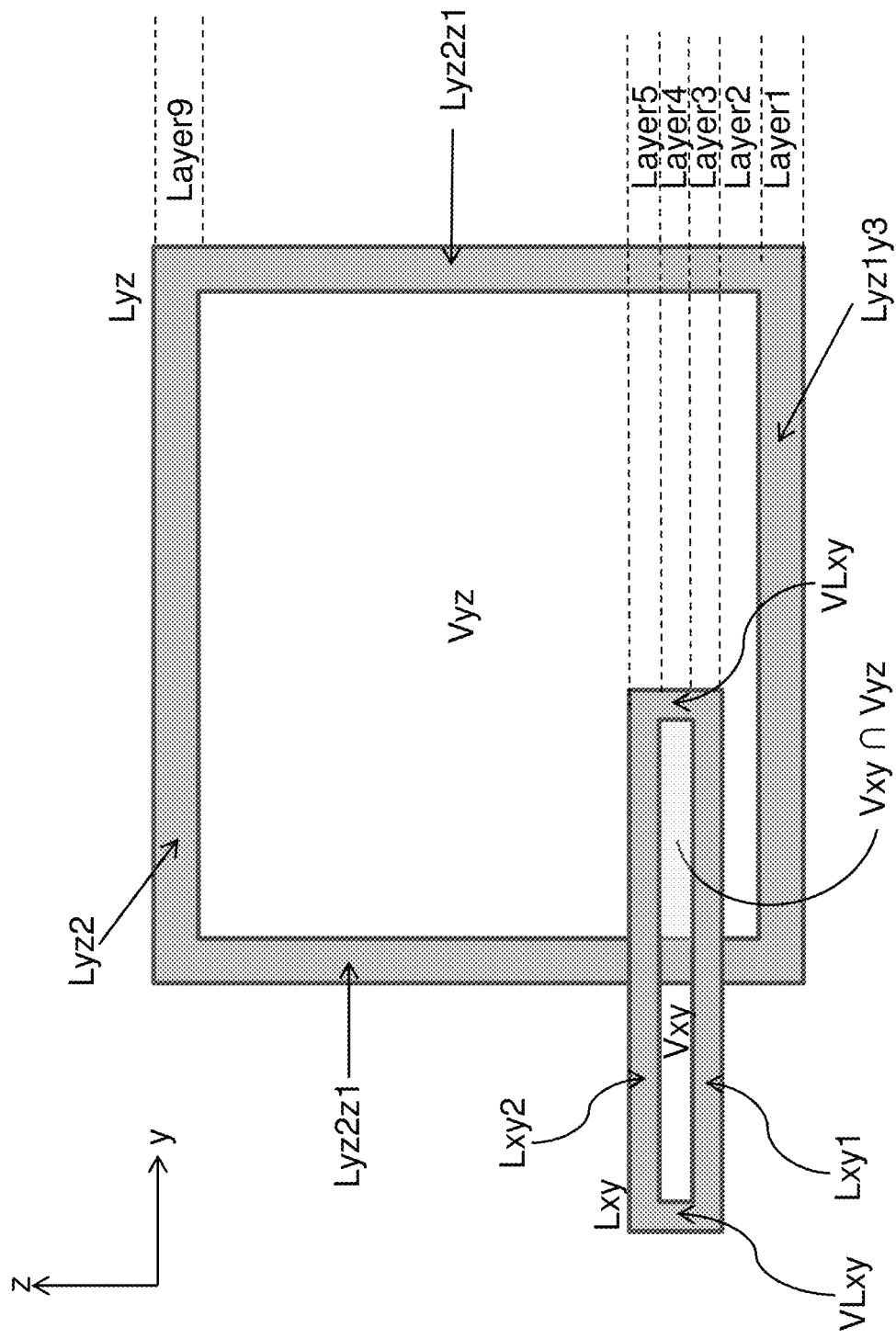
FIG. 3C shows a projection on the (y, z) plane of the two compact isolated inductors of FIG. 3A.

FIG. 3B and FIG. 3C show more details on the sharing of the volume spaces Vxy and Vyz of the two compact isolated inductors shown in FIG. 3A. As can be seen in such figures, only a portion of a projection on the (y, z) plane of the coil structure Lxy is contained within a projection on the (y, z) plane of the coil structure Lyz. In other words, such two projections partially overlap, as opposed to the configuration depicted in FIG. 2A, where one projection (e.g., Lxy) in contained in its entirety within the other (e.g., Lyz).

Figure 4A:
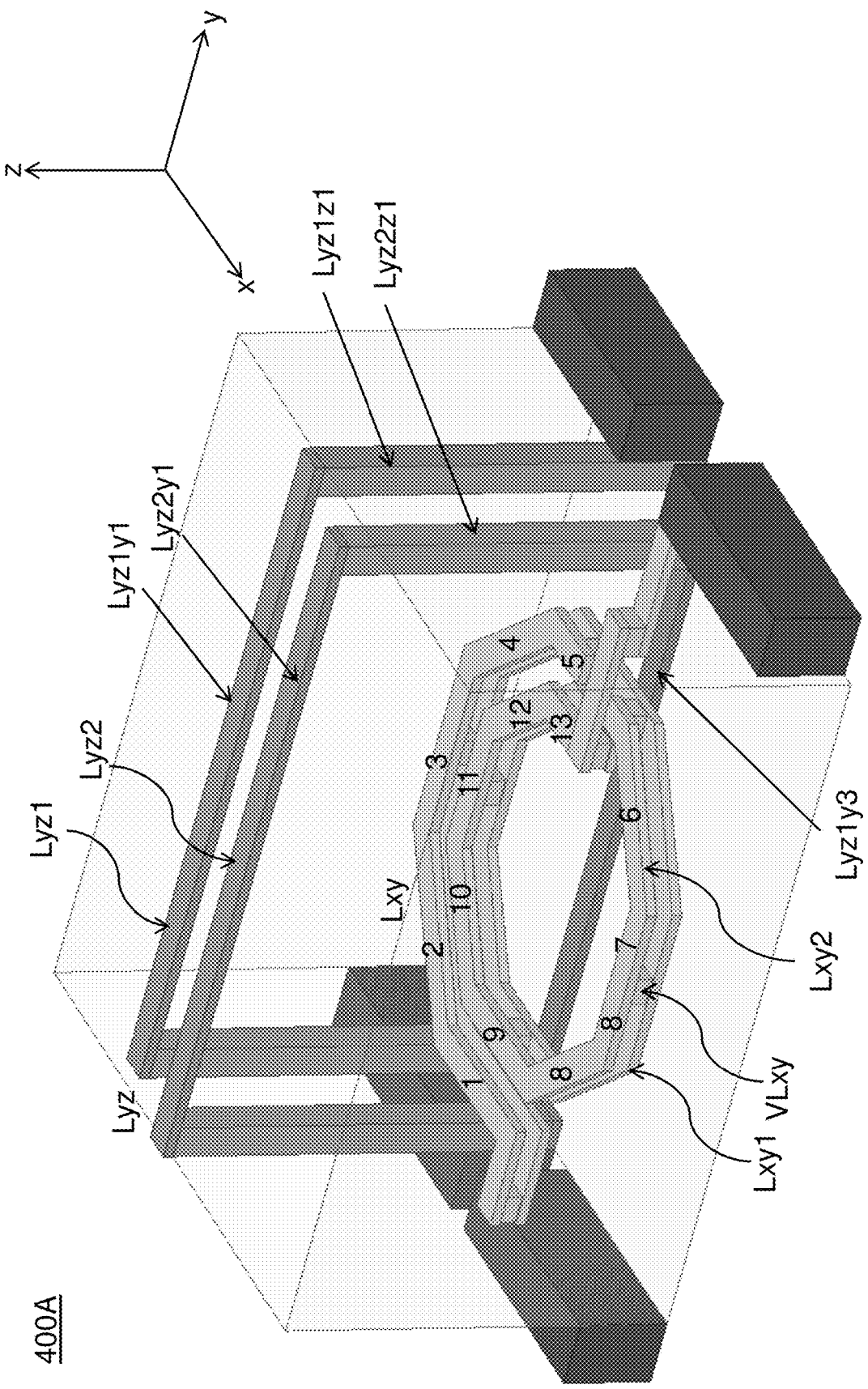
FIG. 4A shows an embodiment according to the present disclosure of two compact isolated inductors with shared volume spaces, wherein one inductor has a coil structure shaped like an octagon.

As described above, shape of the coil windings used in the compact isolated inductors according to the present teachings may be according to any shape forming a loop, such as a polygon or a circle. A person skilled in the art would know that, for example, octagonal or circular shaped coil windings may provide a higher Q (i.e., quality factor) when compared to square shaped coil windings of a same area, whereas the square shaped coil windings may provide for a higher inductance per unit area. Cost and/or other limitations of fabrication methods and technologies used to fabricate the compact isolated inductors may dictate a preferred shape of the coil windings in any two of the three space coordinates of (x, y, z), and in some cases, a preferred shape of conductive segments along one direction in the space coordinates of (x, y, z) used to form such coil windings. FIG. 4A shows an exemplary configuration (400A) according to the present teachings of two compact isolated inductors defined by corresponding coil structures Lxy and Lyz, based on the configuration described above with reference to FIG. 2A, with the difference that the coil structure Lxy has a shape of an octagon formed by, for example, two coil windings Lxy1, Lxy2, that are joined by way of at least one via, VLxy.

As can be seen in the configuration (400A) of FIG. 4A, each of the coil windings Lxy1 and Lxy2 may comprise eight conductive segments (1, 2, . . . , 8) arranged according to an octagon shape. According to a further exemplary embodiment of the present disclosure, one or more of the coil windings Lxy1 and Lxy2 may be spiraled so to form more than one winding loop in a same plane, as shown in FIG. 4A, where by way of additional conductive segments (9, 10, 11, 12, 13) formed in the same layer as the eight conductive segments (1, . . . , 8), the coil winding Lxy2 makes one and one half loops around in the same (x, y) plane. As known to a person skilled in the art, such spiraling of the coil windings (e.g., Lxy2 of FIG. 4A) can be used to increase inductance value of the inductor Lxy while limiting a number of stacked layers used to form the inductor. It should be clear that the spiraling may not be limited to one and one-half loops, as any number on integer or fractional loops may be envisioned.

As described above, by selecting an arbitrary (Cartesian) space coordinate (x, y, z), three inductor coil structures can be formed such that i) their respective magnetic vectors are orthogonal to one another, and ii) their respective volume spaces are shared. Sharing of the volume spaces in a configuration comprising three compact isolated inductors may include sharing of the volume space of any of the three inductors with at least one other inductor of the three inductors according to any of the two configurations depicted in FIG. 2A and FIG. 3A.

Figure 5A:
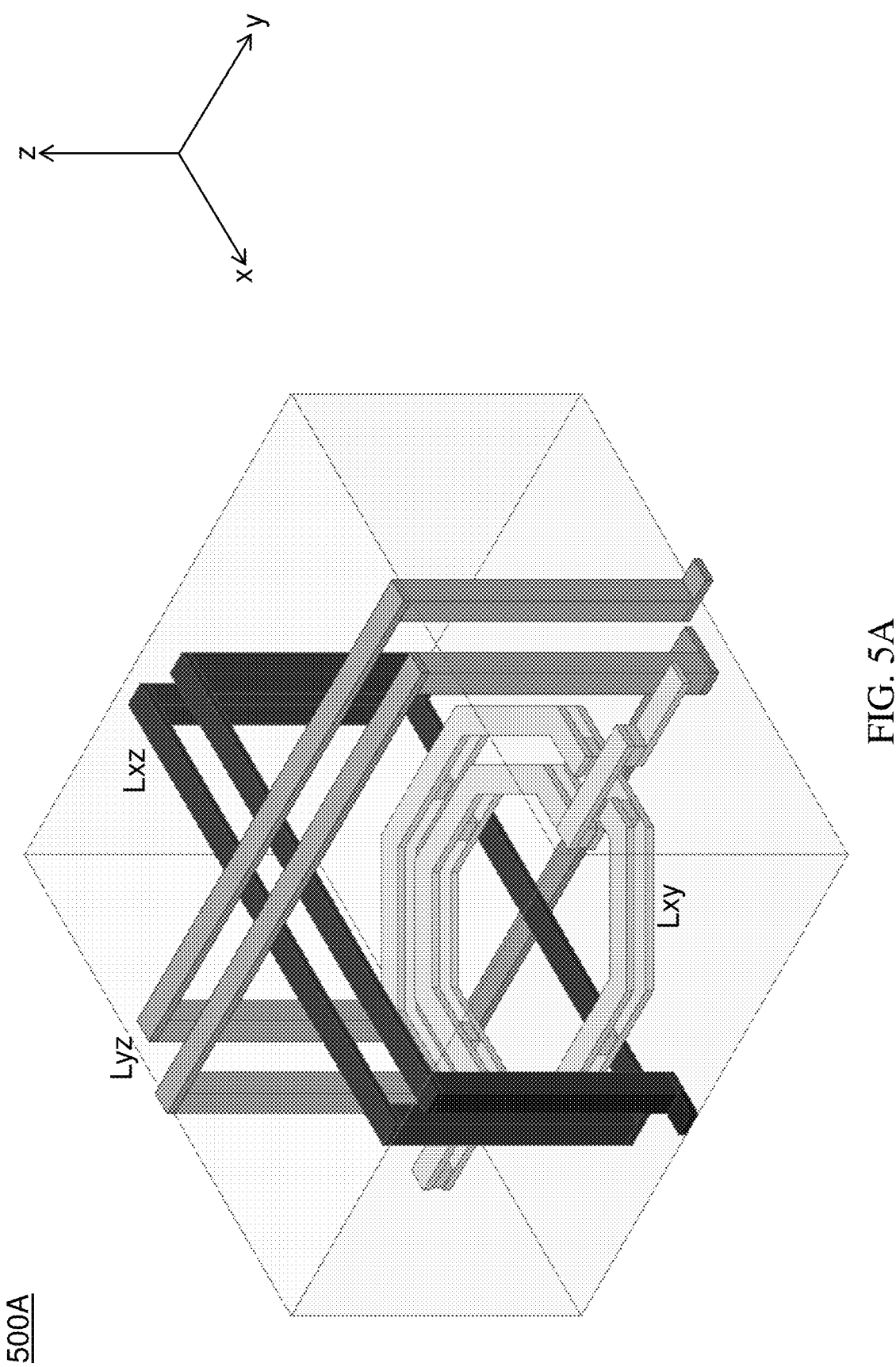
FIG. 5A shows an embodiment according to the present disclosure of three compact isolated inductors with shared volume spaces.

FIG. 5A shows an exemplary configuration (500A) according to an embodiment of the present disclosure of three compact isolated inductors defined by respective coil structures Lxy, Lyz and Lxz, where Lxy and Lyz are according to the description above, and Lxz is an equivalent coil structure whose coil windings are substantially planar according to the plane (x, z). Accordingly, the coil structure Lxz defines a current path through the inductor Lxz that is substantially constrained to the (x, z) plane, and a corresponding magnetic vector, $\vec{By}$, that is in the y-direction of the coordinate space (x, y, z).

Figure 5B:
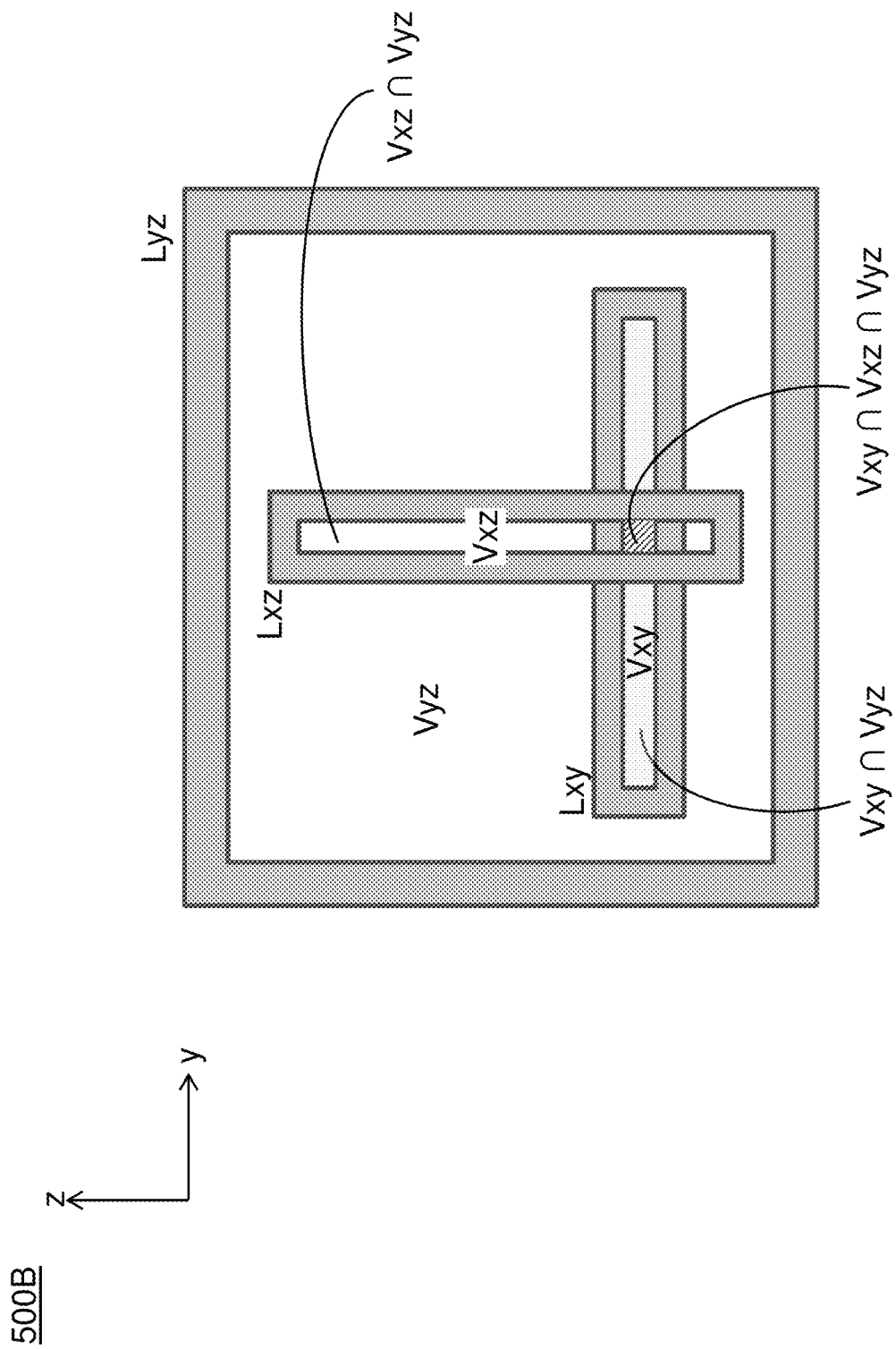
FIG. 5B shows a projection on the (y, z) plane of the three compact isolated inductors of FIG. 5A.

With continued reference to the configuration (500A) of FIG. 5A, the three compact isolated inductors are formed such as i) the coil structures Lxy and Lyz are arranged according to the configuration of FIG. 2A (or FIG. 4A) with the coil structure Lxy passing through the volume space Vyz of the coil structure Lyz, ii) the coil structures Lxz and Lyz are also arranged according to the configuration of FIG. 2A (or FIG. 4A) with the coil structure Lxz passing through the volume space Vyz of the coil structure Lyz, and iii) the coil structures Lxy and Lxz are also arranged according to the configuration of FIG. 2A (or FIG. 4A) with the coil structure Lxy passing through the volume space Vxz of the coil structure Lxz. In other words, while maintaining orthogonality of the three respective magnetic vectors, $\vec{Bz}$, $\vec{By}$, $\vec{Bx}$, sharing of the volume spaces is provided between Lxy and Lyz, between Lxz and Lyz, and between Lxy and Lxz. FIG. 5B shows a projection (500B) of the coil structures Lxy, Lxz and Lyz on the (y, z) plane, including intersections of the volume spaces Vxy, Vxz and Vyz.

Figure 5C:
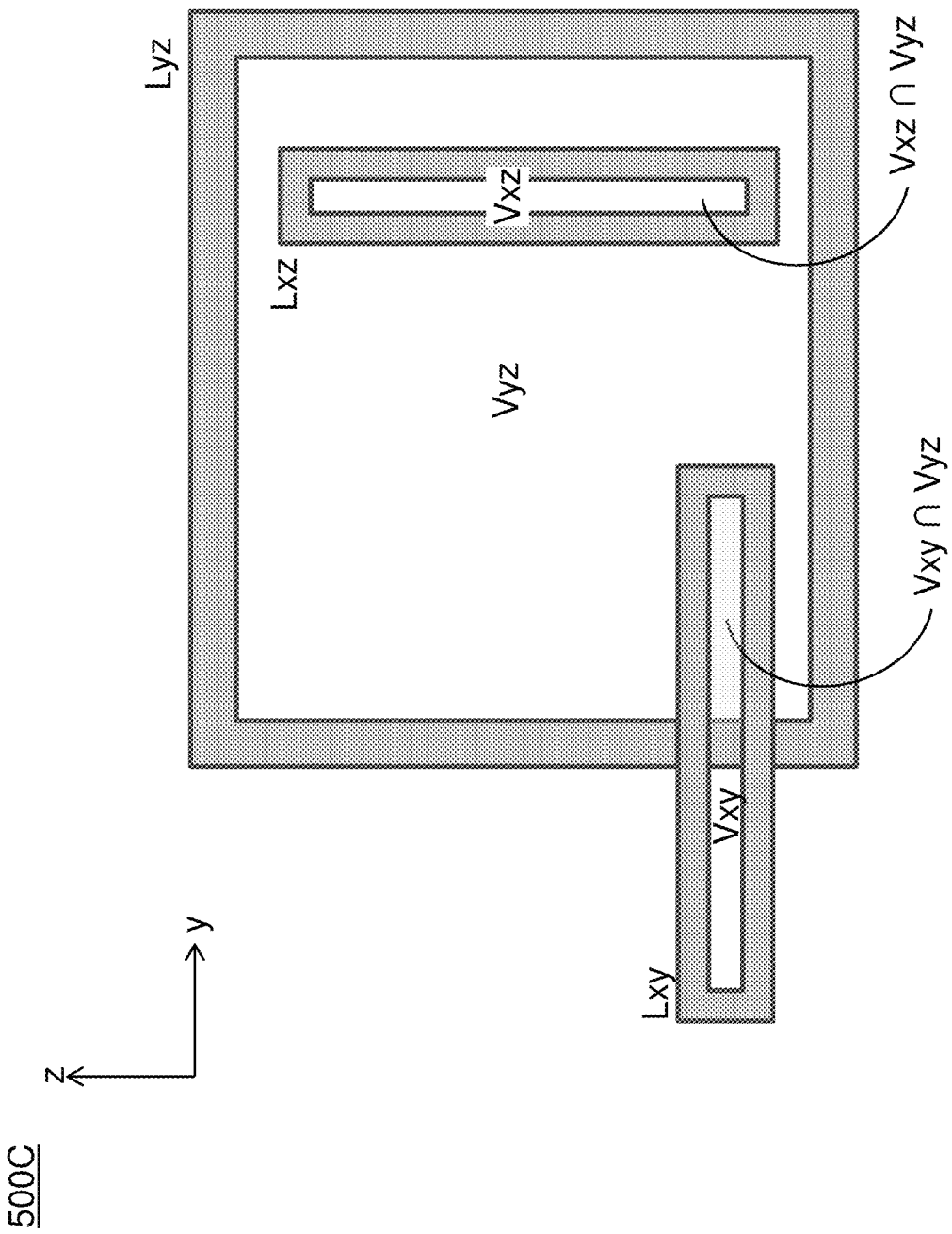
FIG. 5C shows a projection on the (y, z) plane of three compact isolated inductors according to another exemplary embodiment of the present disclosure.
Figure 5D:
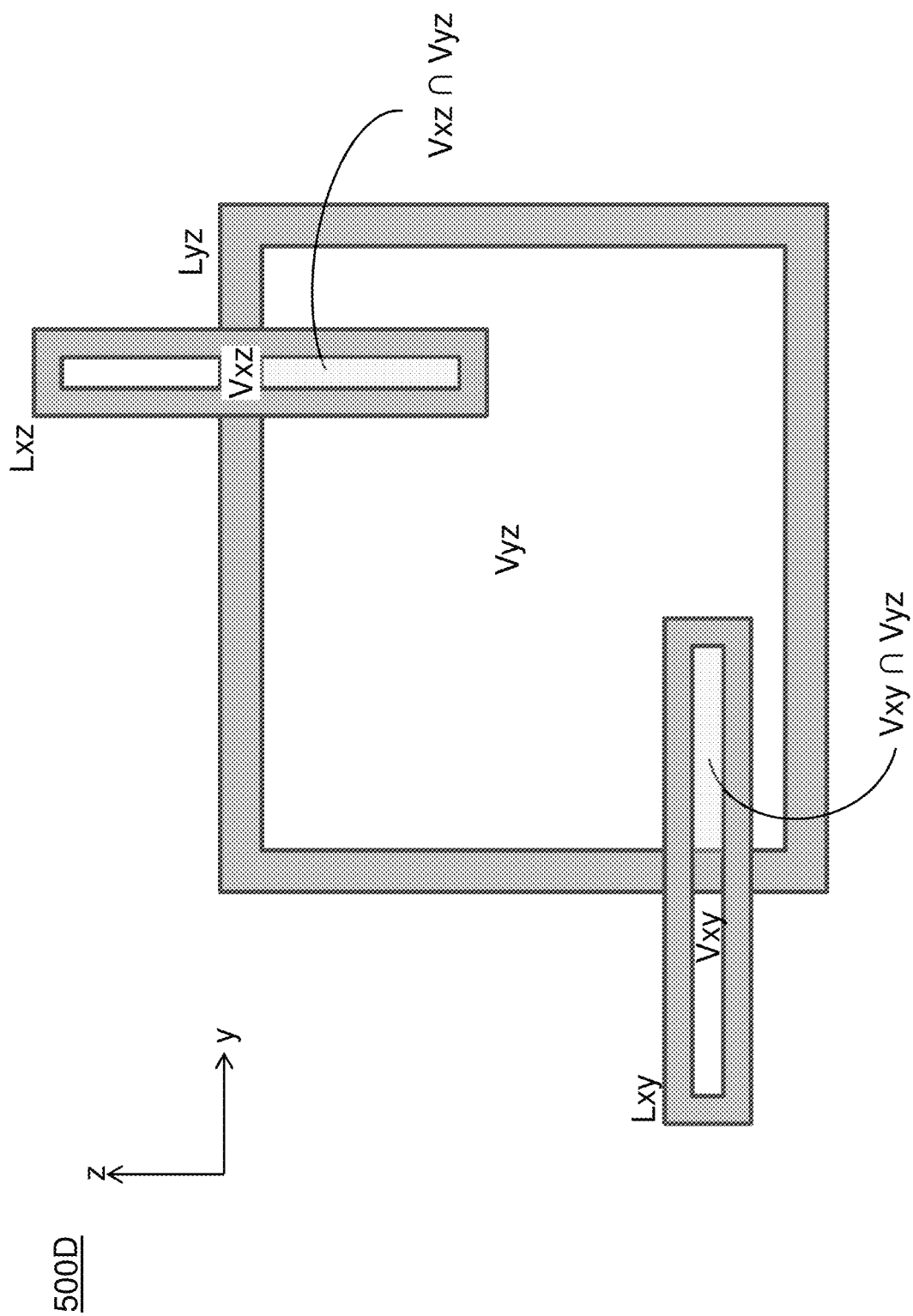
FIG. 5D shows a projection on the (y, z) plane of three compact isolated inductors according to another exemplary embodiment of the present disclosure.

A person skilled in the art would clearly understand that the configuration (500A) of the three isolated inductors depicted in FIG. 5A, having a projection (500B) on the (y, z) plane as depicted in FIG. 5B, is merely exemplary in nature and should therefore not be used as a limitation of the present teachings, as many other three isolated inductors configurations based on the configurations of FIG. 2A and FIG. 3A may be envisioned, as depicted in FIGS. 5C-5D.

FIG. 5C shows a projection (500C) on the (y, z) plane of three compact isolated inductors according to a further exemplary embodiment of the present disclosure, including intersections of the volume spaces Vxy, Vxz and Vyz. As can be seen in FIG. 5C, the three compact isolated inductors are formed such that the corresponding coil structures Lxy and Lyz are according to the configuration of FIG. 3A, and the coil structures Lxz and Lyz are according to the configuration of FIG. 2A. In other words, while maintaining orthogonality of the three respective magnetic vectors, $\vec{Bz}$, $\vec{By}$, $\vec{Bx}$, sharing of the volume spaces is provided between Lxy and Lyz, and between Lxz and Lyz, but not between Lxy and Lxz.

FIG. 5D shows a projection (500D) on the (y, z) plane of three compact isolated inductors according to yet another exemplary embodiment of the present disclosure, including intersections of the volume spaces Vxy, Vxz and Vyz. As can be seen in FIG. 5D, the three compact isolated inductors are formed such that the corresponding coil structures Lxy and Lyz are according to the configuration of FIG. 3A, and the coil structures Lxz and Lyz are also according to the configuration of FIG. 3A. In other words, while maintaining orthogonality of the three respective magnetic vectors, $\vec{Bz}$, $\vec{By}$, $\vec{Bx}$, sharing of the volume spaces is provided between Lxy and Lyz, and between Lxz and Lyz, but not between Lxy and Lxz.

Figure 6A:
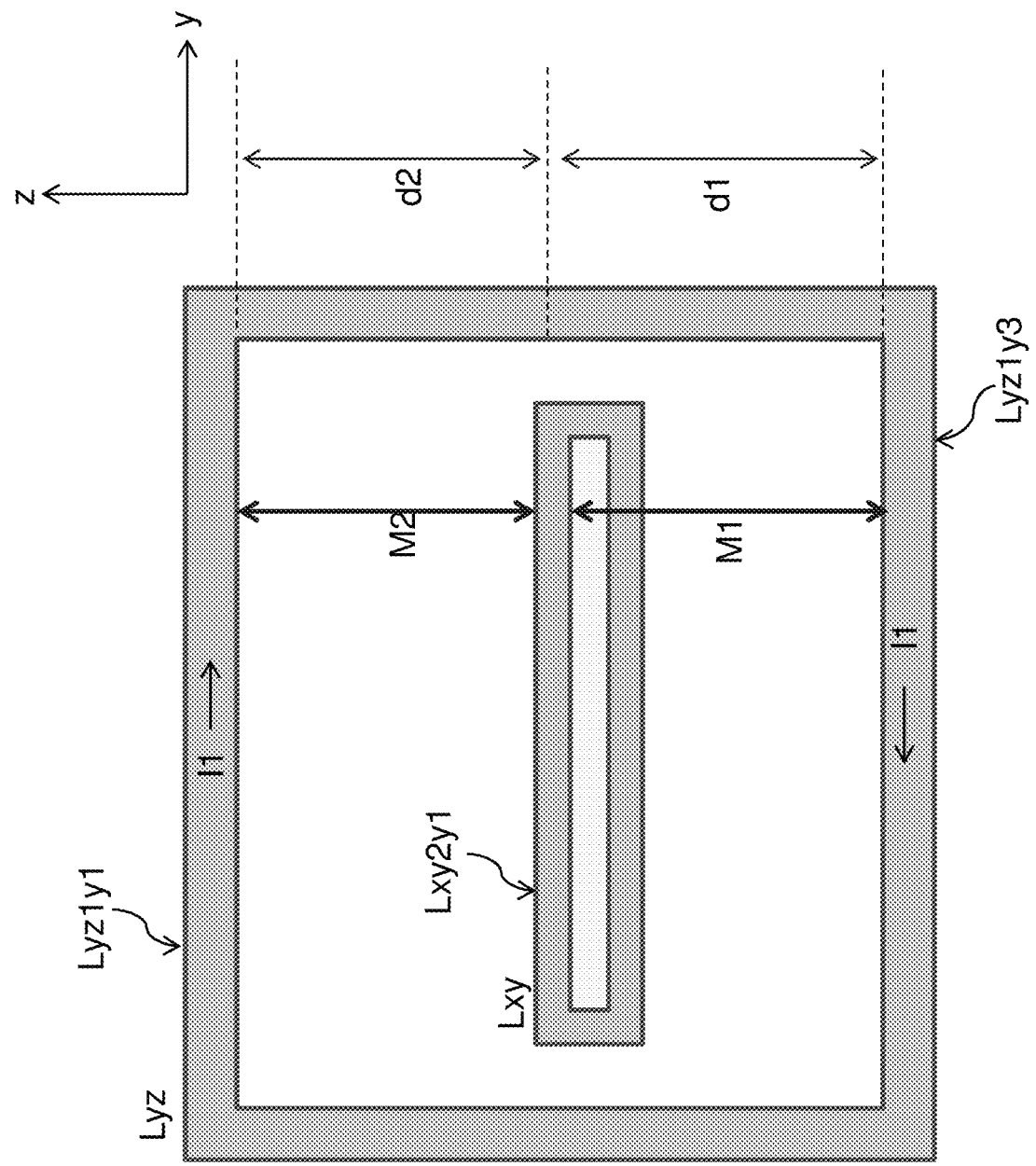
FIG. 6A shows mutual inductances between conductive segments of two compact isolated inductors according to the present teachings that can affect magnetic coupling between the two inductors.

In view of the description above in reference to FIG. 1B, a person skilled in the art would understand that spacing (separation) between parallel conductive segments forming the compact isolated inductors according to the present disclosure may affect magnetic couplings between the inductors via coupling of the near field magnetic vectors. For example, with reference to FIG. 6A which shows projection on the (y, z) plane of two coil structures Lxy and Lyz (e.g., based on for example, FIG. 2A and FIG. 2E), by placing the coil structure Lxy substantially centrally (e.g., d2=d1) in the z-direction with respect to the coil structure Lyz, as shown in the figure, a mutual inductance M1 between the conductive segment Lyz1$y$1 of the coil winding Lyz1 (e.g., see FIG. 2A) of the coil structure Lyz and the conductive segment Lxy2$y$1 of the coil winding Lxy2 (e.g., see FIG. 2A) of the coil structure Lyxy, is substantially equal to a mutual inductance M2 between the bottom segment Lyz1$y$3 of the coil winding Lyz1 of the coil structure Lyz and the conductive segment Lxy2$y$1. Accordingly, since a same current I1 flows (in the y-direction) through the two conductive segments Lyz1$y$1 and Lyz1$y$3 of coil winding Lyz1 according to a path that loops, such current is perceived as having an opposite direction, when seen flowing through such two conductive segments by the conductive segment Lxy2$y$1 of the coil winding Lxy2, as shown in FIG. 6A. Accordingly, it would be clear to a person skilled in the art that the (near field) magnetic coupling effects of the two segments Lyz1$y$1 and Lyz1$y$3 over the segment Lxy2$y$1 cancel one another.

With further reference to FIG. 6A, cancelling of the (near field) magnetic couplings as described above may be maintained so long as a symmetry of conductive segments of the coil windings (e.g., Lyz1, Lyz2 of FIG. 2A) of the coil structure Lyz around the conductive segment Lxy2$y$1 is maintained. In other words, if the conductive structure Lxy2$y$1 of the coil winding Lxy2 sees a same number of similar conductive segments of the coil windings (e.g., Lyz1, Lyz2) of the coil structure Lyz above and below it. This can be true if the coil structure Lyz loops over and under the coil structure Lxy by a same number of times. This is not the case in the exemplary embodiment of the present disclosure shown in FIG. 2A, where it is shown that the coil structure Lyz loops twice over the coil structure Lxy, but loops only once under the same coil structure Lxy. Accordingly, as can be seen in FIG. 2A, the conductive structure Lxy2$y$1 of the coil structure Lxy sees two conductive segments (Lyz1$y$1, Lyz2$y$1) of the coil structure Lyz above it, and only one conductive segment (Lyz1$y$3) of the coil structure Lyz below it. It follows that according to an embodiment of the present disclosure, a relative distance between the two coil structures Lxy, Lyz can be adjusted so to reduce (near field) magnetic coupling between the two coil structures, as shown in FIG. 6B.

Figure 6B:
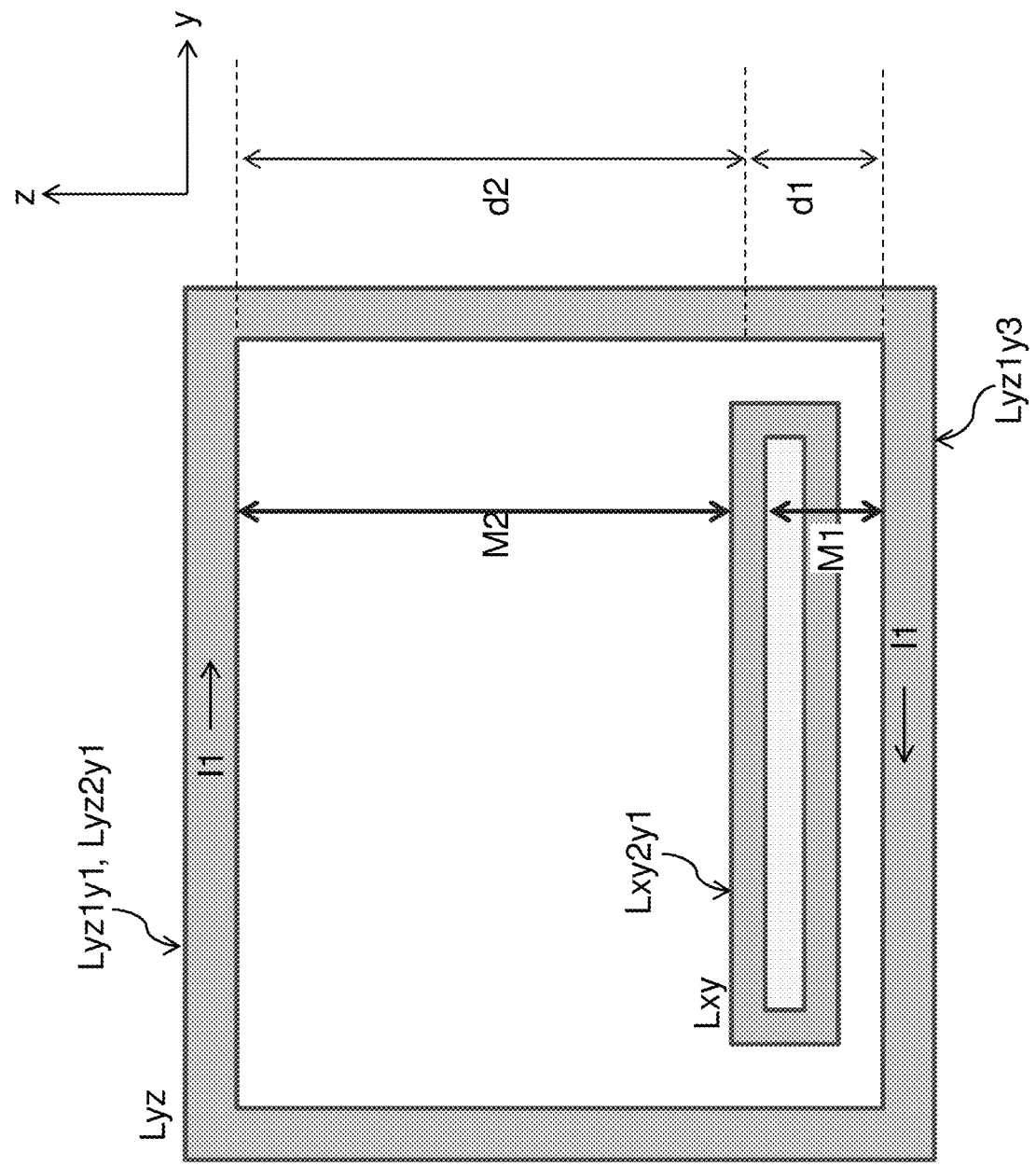
FIG. 6B shows relative placement between two compact isolated inductors according to the present teachings to reduce magnetic coupling effects between the two inductors.

With further reference to FIG. 6B, by placing the coil structure Lxy further away from the top region of the coil structure Lyz and closer to the bottom region of the coil structure Lyz, a mutual inductance M2 that is lower compared to the mutual inductance M1 can be obtained. This in turn allows cancelling out, or reducing, a magnetic coupling effect of the two conductive segments Lyz1$y$1 and Lyz2$y$1 of the coil structure Lyz over the conductive segment Lxy2$y$1 of the coil structure Lxy with a magnetic coupling effect of the conductive segment Lyz1$y$3 of the coil structure Lyz over the conductive segment Lxy2$y$1 of the coil structure Lxy. In other words, a balancing of the mutual inductances M1 and M2 can be provided by the relative placement of the coil structure Lxy with respect to the coil structure Lyz based on a number, N1 and N2, of windings (loops) made by the coil structure Lyz respectively above and below Lxy, such that, for example, if N1=N2, the coil structure Lxy is substantially centered, in the z-direction, with respect to the coil structure Lyz; if N1>N2, the coil structure Lxy is closer, in the z-direction, to the bottom conductive segments (e.g., Lyz1$y$3 of FIGS. 6A-6B) of the coil structure Lyz; and if N1<N2, the coil structure Lxy is closer, in the z-direction, to the top conductive segments (e.g., Lyz1$y$1, Lyz2$y$1 of FIGS. 6A-6B) of the coil structure Lyz. Such relative placement can be considered as balancing effect of currents though the conductive segments Lyz1$y$1 and Lyz1$y$3 of the coil structure Lyz upon the coil structure Lxy. A person skilled in the art would clearly understand that similar analysis may be performed for cancelling near field magnetic coupling effects between segments of any two compact isolated inductors according to the present teachings by considering projections of the coils on different planes to obtain relative placement of the inductors in the coordinate space (x, y, z) for a reduced magnetic coupling. For example, analysis per FIGS. 6A and 6B may provide a relative position of the coils in the z-direction, and a similar analysis by using projections of the coils on, for example, the (x, y) plane, may provide a relative position of the coils in the x- or y-direction.

As described above, the coils of each of the compact isolated inductors according to the present teachings can be formed by one or more coils, each coil having a number of segments, each segment having either a straight or curved shape (having a curvature), where a combination of such segments form a substantially closed shape of the coil. Such flexibility in providing the shape of the coils can be used, according to an embodiment of the present disclosure, to further magnetically isolate the compact isolated inductors by shaping one or more coils of a first inductor to follow (e.g., fully or partially) a near field magnetic vector of the other. By following the near field magnetic vector of the second inductor, magnetic coupling between the two inductors can be reduced as a corresponding near field magnetic vector of the first inductor is orthogonal to the near field magnetic vector of the second inductor. Simulation software/tools can be used to determine a direction of the near field magnetic vector of the compact isolated inductors at any location of the coordinate space (x, y, z).

It should be noted that the various embodiments of the compact isolated inductors according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS).

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A multi-layered structure referenced in a coordinate space (x, y, z), comprising:
   a plurality of conductive and non-conductive layers that are stacked over a substrate, each of said layers being planar according to an (x, y) plane of the coordinate space (x, y, z),
   a first inductor defined by a first coil structure, wherein the first coil structure defines a first volume space of the first inductor; and
   a second inductor defined by a second coil structure, wherein the second coil structure defines a second volume space of the second inductor;
   wherein the first volume space and the second volume space comprise a common shared volume space of the coordinate space (x, y, z), and
   wherein a first far field magnetic vector of the first inductor is substantially orthogonal to a second far field magnetic vector of the second inductor,
   wherein the first coil structure comprises one or more coil windings formed in one or more layers of the multi-layered structure, each of the one or more coil windings of the first coil structure defining a substantially planar first shape in a first plane,
   wherein the second coil structure comprises one or more coil windings formed in one or more layers of the multi-layered structure, each of the one or more coil windings of the second coil structure defining a substantially planar second shape in a second plane,
   wherein the first plane and the second plane are substantially orthogonal,
   wherein the one or more coil windings of the first coil structure are formed in one or more conductive layers of the plurality of conductive and non-conductive layers,
   at least one of the one or more coil windings of the second coil structure is formed through a combination of:
      i) two horizontal conductive segments according to a same direction of the x-direction and y-direction, each of the two horizontal segments formed in a respective one of two separate conductive layers of the one or more conductive and non-conductive layers, and
      ii) two vertical conductive segments according to the z-direction that join the two horizontal conductive segments, each of the two vertical conductive segments formed through a plurality of stacked conductive structures and vias formed across the plurality of conductive and non-conductive layers, wherein the plurality of stacked conductive structures and vias form offsets in the two vertical conductive segments.

2. The multi-layered structure according to claim 1, wherein one of the first coil structure and the second coil structure passes through the volume space defined by the other coil structure.

3. The multi-layered structure according to claim 1, wherein the one or more coil windings of the first coil structure and the one or more coil windings of the second coil structure are interlaced.

4. The multi-layered structure according to-claim 1, wherein the one or more coil windings of the first coil structure are joined through one or more conductive vias formed across the one or more conductive layers.

5. The multi-layered structure according to claim 1, wherein:
   the one or more conductive layers that form the one or more coil windings of the first coil structure are arranged between the two separate conductive layers that form the two horizontal conductive segments.

6. The multi-layered structure according to claim 5, wherein:
   one of the two vertical conductive segments passes through the first volume space, and the other of the two vertical conductive segments does not pass through the first volume space.

7. The multi-layered structure according to claim 5, wherein:

the two vertical conductive segments pass through the first volume space.

8. The multi-layered structure according to claim 1, wherein a shape of a cross section in the (x, y) plane of the two vertical conductive segments is according to one or more of: a) a quadrilateral, b) a polygon, and c) a circle.

9. The multi-layered structure according to claim 1, wherein:
the one or more coil windings of the first coil structure comprise a first plurality of parallel conductive segments formed in the one or more layers of the multi-layered structure that are according to a first direction in the coordinate space (x, y, z),
the one or more coil windings of the second coil structure comprise a second plurality of parallel conductive segments formed in the one or more layers of the multi-layered structure that are according to the first direction, and
a relative position of the first coil structure with respect to the second coil structure in a second direction that is substantially orthogonal to the first direction, is based on a difference in a number, N1, of parallel conductive segments of the second plurality of parallel conductive segments that are positioned above, according to the second direction, the first plurality of parallel conductive segments, and a number, N2, of parallel conductive segments of the second plurality of parallel conductive segments that are positioned below, according to the second direction, the first plurality of parallel conductive segments.

10. The multi-layered structure according to claim 9, wherein the relative position is configured to affect the mutual inductance between the first and second coil structure so to reduce a magnetic coupling between the first and second inductors.

11. The multi-layered structure according to claim 10, wherein:
if N1=N2, the relative position is so that in the second direction, the first coil structure is substantially centered with respect to the second plurality of parallel conductive segments that are positioned above and below the first plurality of parallel conductive segments,
if N1>N2, the relative position is so that in the second direction, the first coil structure is closer to the second plurality of parallel conductive segments that are positioned below than to the second plurality of parallel conductive segments that are positioned above the first plurality of parallel conductive segments, and
if N1<N2, the relative position is so that in the second direction, the first coil structure is closer to the second plurality of parallel conductive segments that are positioned above than to the second plurality of parallel conductive segments that are positioned below the first plurality of parallel conductive segments.

12. The multi-layered structure according to claim 1, wherein a coil winding of the one or more coil windings of the first coil structure have a shape that follows a near field magnetic vector of a coil winding of the one or more coil windings of the second coil structure.

13. The multi-layered structure according to claim 1, further comprising:
a third inductor defined by a third coil structure, wherein the third coil structure defines a third volume space of the third inductor;
wherein the third volume space and at least one of the first volume space and the second volume space comprise a common shared volume space of the coordinate space (x, y, z), and
wherein a third far field magnetic vector of the third inductor is substantially orthogonal to the first far field magnetic vector of the first inductor and to the second far field magnetic vector of the second inductor.

14. The multi-layered structure according to claim 1, wherein the multilayered structure is configured as a single package formed on a same substrate, comprising external pads that are electrically connected to the first and second inductors.

15. The multi-layered structure according to claim 14, wherein the single package comprises two pads for each of the first and second inductors.

16. The multi-layered structure according to claim 14, wherein the single package comprises one pad for each of the first and second inductors, and a common pad for both the first and second inductors.

17. The multi-layered structure according to claim 14, wherein the single package is formed according to a packaging technology comprising one of: a) surface mount device (SMD), b) integrated passive device (IPD), and c) low temperature co-fired ceramics (LTCC).

18. A multi-layered structure referenced in a coordinate space (x, y, z), comprising:
a first inductor defined by a first coil structure, wherein the first coil structure defines a first volume space of the first inductor; and
a second inductor defined by a second coil structure, wherein the second coil structure defines a second volume space of the second inductor;
wherein the first volume space and the second volume space comprise a common shared volume space of the coordinate space (x, y, z),
wherein the first coil structure comprises one or more coil windings formed in one or more layers of the multi-layered structure,
wherein the second coil structure comprises one or more coil windings formed in one or more layers of the multi-layered structure,
wherein the one or more coil windings of the first coil structure comprise a first plurality of parallel conductive segments formed in the one or more layers of the multi-layered structure that are according to a first direction in the coordinate space (x, y, z),
wherein the one or more coil windings of the second coil structure comprise a second plurality of parallel conductive segments formed in the one or more layers of the multi-layered structure that are according to the first direction, and
wherein a relative position of the first coil structure with respect to the second coil structure in a second direction that is substantially orthogonal to the first direction, is based on a difference in a number, N1, of parallel conductive segments of the second plurality of parallel conductive segments that are positioned above, according to the second direction, the first plurality of parallel conductive segments, and a number, N2, of parallel conductive segments of the second plurality of parallel conductive segments that are positioned below, according to the second direction, the first plurality of parallel conductive segments, such that:
if N1=N2, the relative position is so that in the second direction, the first coil structure is substantially centered with respect to the second plurality of parallel conductive segments that are positioned above and below the first plurality of parallel conductive segments, if N1>N2, the relative position is so that in the second direction, the first coil structure is closer to the second plurality of parallel conductive segments that are positioned below than to the second plurality of parallel conductive segments that are positioned above the first plurality of parallel conductive segments, and if N1<N2, the relative position is so that in the second direction, the first coil structure is closer to the second plurality of parallel conductive segments that are positioned above than to the second plurality of parallel conductive segments that are positioned below the first plurality of parallel conductive segments.

19. A multi-layered structure referenced in a coordinate space (x, y, z), comprising:

a plurality of conductive and non-conductive layers that are stacked over a substrate, each of said layers being planar according to an (x, y) plane of the coordinate space (x, y, z), a first inductor defined by a first coil structure, wherein the first coil structure defines a first volume space of the first inductor; and a second inductor defined by a second coil structure, wherein the second coil structure defines a second volume space of the second inductor;

wherein the first volume space and the second volume space comprise a common shared volume space of the coordinate space (x, y, z), wherein the first coil structure comprises one or more coil windings formed in one or more layers of the multi-layered structure, wherein the second coil structure comprises one or more coil windings formed in one or more layers of the multi-layered structure, and wherein at least one of the one or more coil windings of the second coil structure comprises:

two vertical conductive segments according to the z-direction that join two horizontal conductive segments, each of the two vertical conductive segments formed through a plurality of stacked conductive structures and vias formed across the plurality of conductive and non-conductive layers, wherein the plurality of stacked conductive structures and vias form offsets in the two vertical conductive segments.

* * * * *